United States Patent
Shah et al.

(10) Patent No.: US 11,824,537 B2
(45) Date of Patent: Nov. 21, 2023

(54) INTERLEAVED RING OSCILLATOR FOR NON-OVERLAPPING CLOCK

(71) Applicant: Robert Bosch GmbH, Stuttgart (DE)

(72) Inventors: Nishit Shah, Stanford, CA (US); Pedram Lajevardi, Menlo Park, CA (US); Kenneth Wojciechowski, Cupertino, CA (US); Christoph Lang, Sunnyvale, CA (US)

(73) Assignee: ROBERT BOSCH GMBH

(*) Notice: Subject to any disclaimer, the term of this patent is extended or adjusted under 35 U.S.C. 154(b) by 377 days.

(21) Appl. No.: 16/987,317

(22) Filed: Aug. 6, 2020

(65) Prior Publication Data

US 2021/0058075 A1 Feb. 25, 2021

Related U.S. Application Data

(60) Provisional application No. 62/889,481, filed on Aug. 20, 2019.

(51) Int. Cl.
   *H03K 3/03* (2006.01)
(52) U.S. Cl.
   CPC ................... *H03K 3/0315* (2013.01)
(58) Field of Classification Search
   CPC ... H03K 3/0315; H03K 5/1515; H03L 7/0995
   See application file for complete search history.

(56) References Cited

U.S. PATENT DOCUMENTS

| | | | |
|---|---|---|---|
| 5,475,344 A | 12/1995 | Maneatis et al. | |
| 7,683,726 B2* | 3/2010 | Kim | H03K 5/133 331/45 |
| 9,588,497 B1 | 3/2017 | Monk et al. | |
| 9,812,952 B2 | 11/2017 | Huang et al. | |
| 2015/0180455 A1* | 6/2015 | Beccue | H03K 3/0315 331/57 |
| 2017/0040941 A1* | 2/2017 | Chatwin | H03B 1/04 |
| 2017/0155395 A1 | 6/2017 | Grollitsch et al. | |
| 2018/0019757 A1* | 1/2018 | Schober | H03L 7/0995 |
| 2018/0262104 A1 | 9/2018 | Huang et al. | |

OTHER PUBLICATIONS

Manu Rastogi, "Design Optimizations of Spiking Hardware Neurons", A Dissertation Presented to The Graduate School of The University of Florida in Partial Fulfillment of The Requirements for The Degree of Doctor of Philosophy, University of Florida, 2012, 124 pages.

(Continued)

*Primary Examiner* — Jeffrey M Shin
(74) *Attorney, Agent, or Firm* — Dickinson Wright PLLC

(57) ABSTRACT

An interleaved ring oscillator includes a first ring oscillator having n stages, and a second ring oscillator having n stages, wherein each stage includes a $n^{th}$ first gated inverter in the first ring oscillator and a $n^{th}$ second gated inverter in the second ring oscillator, such that output from the $n^{th}$ first gated inverter enables the $n^{th}$ second gated inverter, and output from the $n^{th}$ second gated inverter enables the $n^{th}$ first gated inverter.

16 Claims, 32 Drawing Sheets

(56) References Cited

OTHER PUBLICATIONS

Ping Zhao, Energy Harvesting Techniques for Autonomous WSNs/RFID with a Focus on RF Energy Harvesting, Apr. 27, 2012, 160 pages.
I. Cevik, X. Huang, H. Yu, M. Yan and S. U. Ay, "An ultra-low power CMOS image sensor with on-chip energy harvesting and power management capability," Sensors, vol. 15, No. 3, pp. 5531-5554, Mar. 2015, 24 pages.
K. Z. Ahmed, M. F. Amir, J. H. Ko and S. Mukhopadhyay, "Reconfigurable 96x128 active pixel sensor with 2.1 µw/mm2 power generation and regulated multi-domain power delivery for self-powered imaging," in Proc. Eur. Solid-State Circuit Conf. (ESSCIRC), Sep. 2016, pp. 507-510, 4 pages.
S. Carreon-Bautista, L. Huang and E. Sanchez-Sinencio, "An autonomous energy harvesting power management unit with digital regulation for iot applications," IEEE J. Solid State Circuits, pp. 1457-1473, Jun. 2016, 18 pages.
S. Yuvarajan and L. Wang, "Power Conversion and Control using a Current Sensing MOSFET", in Proc. 34th Midwest Symposium on Circuits and Systems, vol. I. [9] 1445-1450, 1990 p. 166-169, 1992, 4 pages.
H. P. Forghani-zadeh and G. A. Rincon-Mora, "Current-sensing techniques for DC-DC converters," IEEE Midwest Symp. on Circuits and Systems, pp. 577-580. Aug. 2002, 4 pages.
First Office Action for Chinese Application No. 202010843734.4, dated Aug. 8, 2023, 8 pages.

\* cited by examiner

INTERLEAVED RING OSCILLATOR FOR NON-OVERLAPPING CLOCK

CROSS-REFERENCE TO RELATED APPLICATIONS

This application claims the benefit of U.S. provisional application Ser. No. 62/889,481 filed Aug. 20, 2019, the disclosure of which is hereby incorporated in its entirety by reference herein.

TECHNICAL FIELD

This invention relates generally to a system and method of generating non-overlapping clocks in a low power system.

BACKGROUND

Physical world information is analog while most information processing on semiconductors is digital. This analog to digital conversion requires sampling at discrete time intervals. Most sampling circuits employ switched capacitor circuits that need different non-overlapping clocks.

Another application in which non-overlapping clocks are used is to generate different power supply voltages for integrated circuits (ICs). Many ICs have a few input supply voltages while most sub-blocks need different supply voltages to operate at maximum efficiency. Power converters with switching inductors and capacitors at distinct non-overlapping clock phases achieve this.

SUMMARY

An interleaved ring oscillator includes a first ring oscillator and a second ring oscillator. The first ring oscillator has, in a first stage, a first inverter that is gated by a first high-side switch and a first low-side switch and the second ring oscillator has, in the first stage, a second inverter that is gated by a second high-side switch and a second low-side switch. The first ring oscillator generates a first phase clock signal, and the second ring oscillator generates a second phase clock signal that is out of phase with the first phase clock signal.

An interleaved ring oscillator includes a first ring oscillator having n stages, and a second ring oscillator having n stages, wherein each stage includes a $n^{th}$ first gated inverter in the first ring oscillator and a $n^{th}$ second gated inverter in the second ring oscillator, such that output from the $n^{th}$ first gated inverter enables the $n^{th}$ second gated inverter, and output from the $n^{th}$ second gated inverter enables the $n^{th}$ first gated inverter.

Another embodiment includes a ring oscillator with a first ring oscillator and a second ring oscillator, wherein the first ring oscillator and the second ring oscillator are coupled such that the output of the first ring oscillator is an input to the second ring oscillator, and the second ring oscillator is an input to the first ring oscillator, wherein the first ring oscillator and the second ring oscillator each include one or more stages, wherein each stage includes a $n^{th}$ first gated inverter in the first ring oscillator and a $n^{th}$ second gated inverter in the second ring oscillator such that output from the $n^{th}$ first gated inverter enables the $n^{th}$ second gated inverter, and output from the $n^{th}$ second gated inverter enables the $n^{th}$ first gated inverter.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

The term "substantially" may be used herein to describe disclosed or claimed embodiments. The term "substantially" may modify a value or relative characteristic disclosed or claimed in the present disclosure. In such instances, "substantially" may signify that the value or relative characteristic it modifies is within ±0%, 0.1%, 0.5%, 1%, 2%, 3%, 4%, 5% or 10% of the value or relative characteristic.

The use of distributed sensor nodes employing energy harvesting techniques may improve the battery life and form factor. Using the sensor itself as an energy harvesting element is an attractive option to further reduce the cost and footprint of such nodes. A CMOS image sensor is one example where the pixel array can be reconfigured to harvest incident light. Several applications, including warehouse inventory tracking and structural fault detection, capture images at a slow rate such as once every 2-5 minutes and are thus compatible with ultra-low energy harvesting power levels. However, a key challenge to this circuitry configuration is to ensure a robust cold start and efficient operation over a wide range of light intensities.

Energy harvesting from an imager pixel array utilizes the pixel array to generate energy when not being used to capture an image. However, the pixel array needs modifications to multiplex between an energy harvesting mode and an image capture mode. The modifications result in a low fill factor and large pixel pitch (i.e., reduced image resolution). Moreover, the system modifications require a battery or an off-chip inductor for start-up (i.e., cold start). Also, for energy-efficient operation under varying light intensity, prior-art designs employ maximum input power point tracking (MPPT). However, this does not necessarily lead to maximum power delivery to the load.

Other related work in this area has explored more generic energy harvesters with power management capabilities. A dedicated charge-pump is used to enable cold start, but this comes with significant area overhead. The design of employs off-chip solar cells, which add extra cost and footprint to the sensor node.

Figure 1:
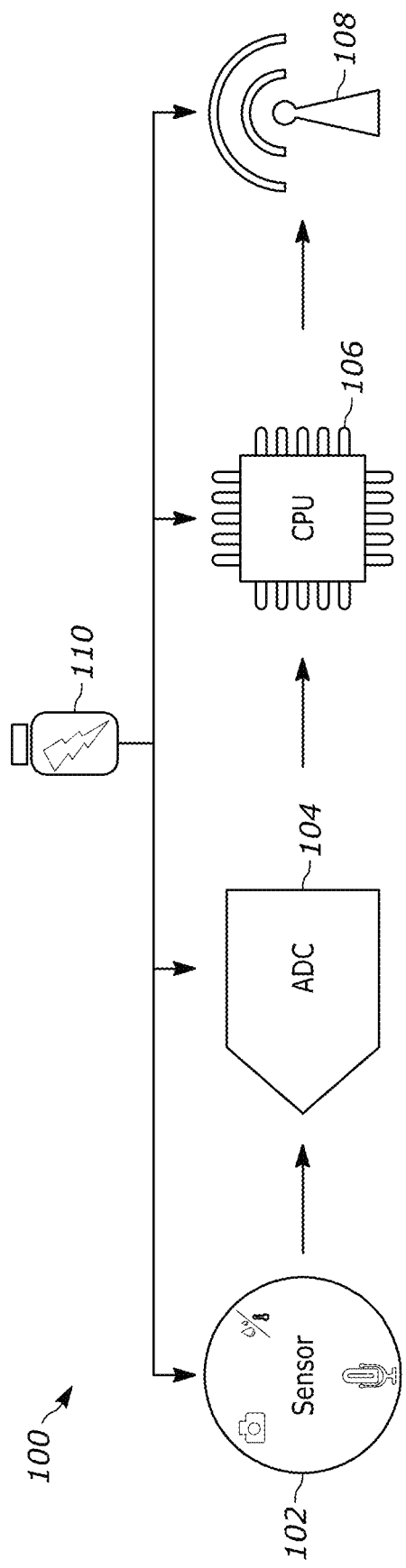
FIG. 1 is a block diagram of a battery powered sensor node.

FIG. 1 is a block diagram of a battery powered sensor node 100. The sensor node 100 includes at least one sensor 102 such as an imaging sensor, microphone, humidity sensor, pressure sensor, infrared sensor, magnetic sensor, temperature sensor, or a combination thereof. An output of the sensor 102 may then be converted from an analog signal to a digital signal via an Analog to Digital Converter (ADC) 104 and the digital signal may then be processed by a Central Processing Unit (CPU) 106. The sensor node also includes a communication node 108. The communication node 108 may be a wireless node configured to communicate via a wireless protocol such as cellular, 802.11 (Wi-Fi), 802.15, Optical (e.g., via an optical fiber), Infrared (e.g., IrDA), or sound waves (e.g., ultrasonic). Here the sensor node 100 is powered by a battery 110 or alternatively connected to a power grid, for example via an AC/DC converter.

Figure 2:
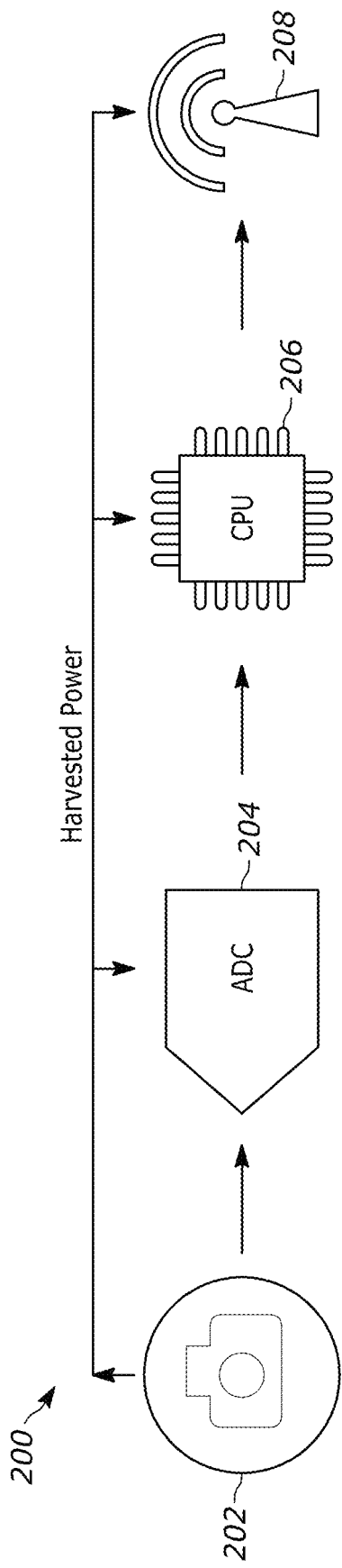
FIG. 2 is a block diagram of an energy harvesting sensor node.

FIG. 2 is a block diagram of an energy harvesting sensor node 200. The sensor node 200 includes at least one sensor 202 such as an imaging sensor, microphone, humidity sensor, pressure sensor, infrared sensor, magnetic sensor, temperature sensor, or a combination thereof. An output of the sensor 202 may then be converted from an analog signal to a digital signal via an Analog to Digital Converter (ADC) 204 and the digital signal may then be processed by a Central Processing Unit (CPU) 106. The sensor node also includes a communication node 208. The communication node 208 may be a wireless node configured to communicate via a wireless protocol such as cellular, 802.11 (Wi-Fi), 802.15, Optical (e.g., via an optical fiber), Infrared (e.g., IrDA), or sound waves (e.g., ultrasonic). Here the sensor node 200 is powered by the sensor 202 that includes an energy harvesting system or alternatively can be selectively configured as an energy harvesting system.

Figure 3:
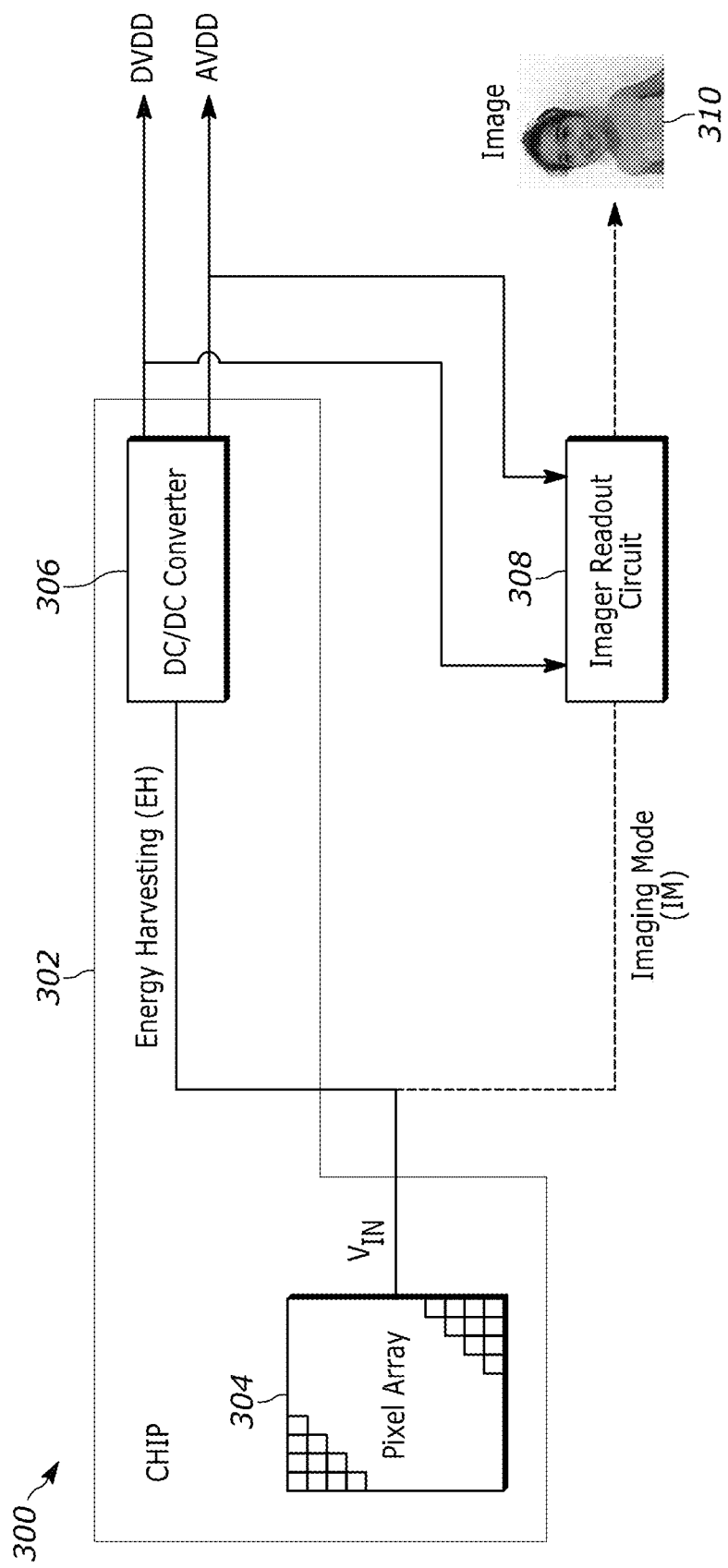
FIG. 3 is a block diagram of an exemplary energy harvesting image sensor node.

FIG. 3 is a block diagram of an exemplary energy harvesting sensor node 300. The sensor node 300 includes an integrated circuit (IC) 302 that includes a pixel array 304 and a DC/DC converter 306. The IC 302 is shown configured to operate the pixel array 304 as either a voltage source to power the DC/DC converter generating at least one voltage level, or in an imaging mode in which the digital signal of the captured image is sent to an image readout circuit 308 that may be used to create a remote image 310.

For example, consider a fully integrated energy harvester IC using conventional 4-T image sensor pixels with no change in fill factor or pixel pitch arranged as a QVGA (320×240) pixel array. This image sensor being configured to operate in an imaging mode ($I_M$) or an energy harvesting mode (EH) refer back to FIG. 3. This design includes a DC/DC converter 306 such as a switched-capacitor ($S_C$) boost converter that steps up the pixel array voltage ($V_{IN}$) to produce two output voltages ($A_{VDD}$ and $D_{VDD}$) for a standard imager readout. The readout circuitry was not included monolithically in this prototype, but due to the unaltered pixel structure, this integration should be relatively straightforward.

Next we will describes the IC chip architecture and its key building blocks followed by circuit details and concluding with measured results from a prototype fabricated in a sub 500 nm CMOS Image Sensor (CIS) process, however the concepts disclosed in this application are not limited to these technologies.

Figure 4:
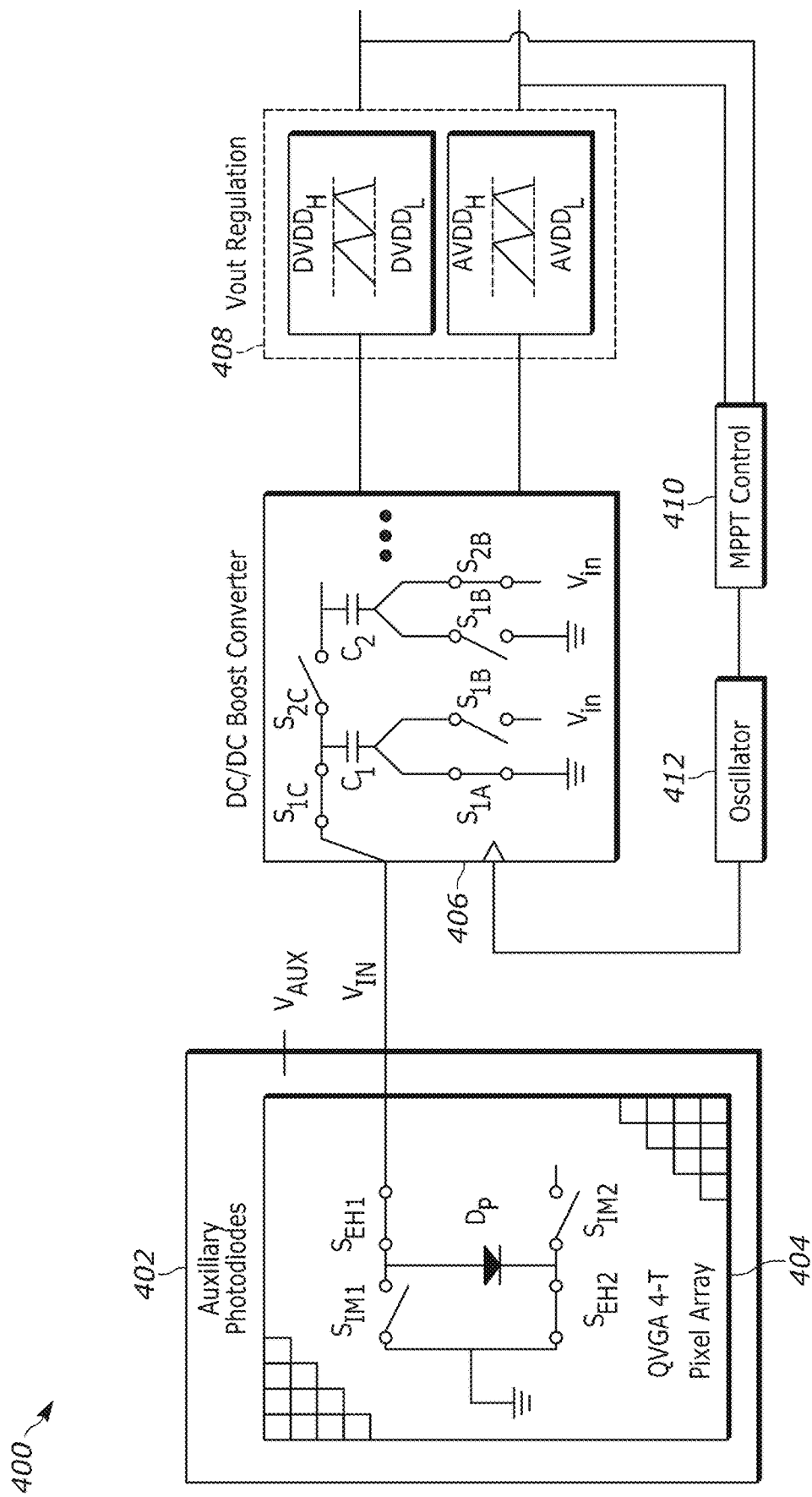
FIG. 4 is a block diagram of an energy harvesting system powered by image sensor pixels.

FIG. 4 is a block diagram of an energy harvesting image sensor system 400. The sensor system 400 includes an image area 402 with an image/pixel array 404 and auxiliary photodiodes. The array 404 is coupled with a DC/DC converter 406 and voltage regulator 408 in which the regulated output is feedback to the DC/DC converter 406 via a MPPT controller 401 and oscillator 412. The QVGA pixel array is forward biased when configured in Energy Harvesting (EH) mode. When illuminated, the pixel array 404 harvests energy and generates $V_{IN}$ between 0.25-0.4 V, depending on the light intensity. This voltage ($V_{IN}$) is boosted to digital ($D_{VDD}$) and analog ($A_{VDD}$) supplies, which are regulated to 0.6 V and 1.8 V using hysteretic control circuits. The SC converter operates with non-overlapping clocks from an oscillator. The oscillator frequency is set by an MPPT algorithm to maximize the power delivered to the load under varying light and load conditions. The auxiliary photodiodes, adjacent to pixel array, capture fringe light at the periphery of the imager pixel array to enable cold start.

Figure 33:
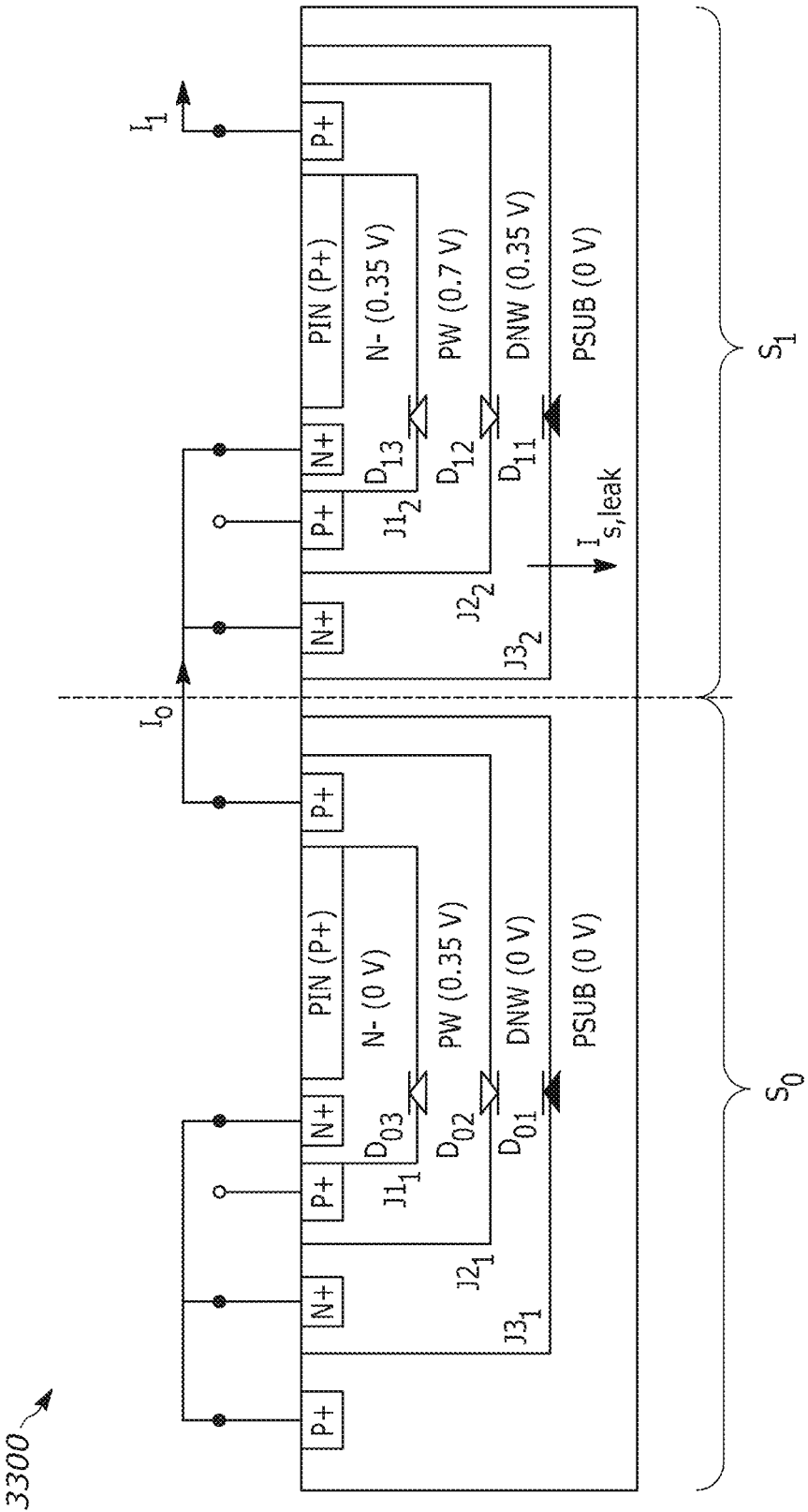
FIG. 33 is cross-sectional diagram of an embodiment of two semiconductor structures configured to capture light.
Figure 34:
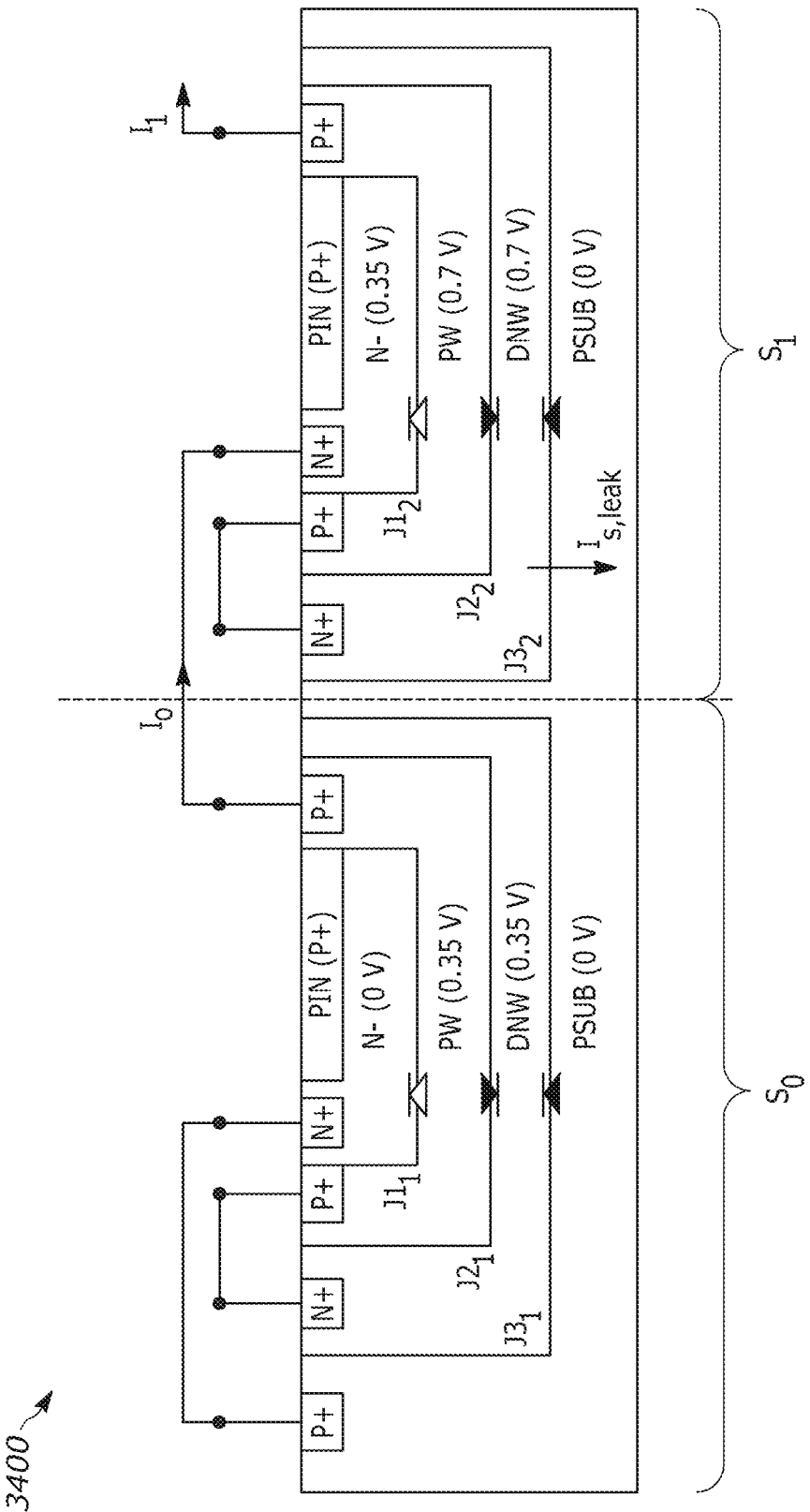
FIG. 34 is cross-sectional diagram of an alternative embodiment of two semiconductor structures configured to capture light.

The QVGA pixel array consists of conventional 4-T pixels. Each pixel is embedded in a shared PWell and deep Well as shown in FIGS. 33 and 34. The PWell-to-Ndiffusion (PD1) junction is reverse biased while the PWell-to-deep-NWell (PD2) junction is shorted during Imagining (IM) mode. The PD1's junction depth is unaltered and therefore has a negligible effect on image quality.

During EH mode, the NMOS transfer gate and reset transistor of the 4-T pixel biases the Ndiffusion to GND. The forward biased PD1 and PD2 junctions harvest energy from light at different wavelengths, generating a positive $V_{IN}$ at the PWell node. The full array may be configured to share one set of reconfiguration switches outside the array to multiplex it between IM and EH mode. This approach is pixel-pitch agnostic and does not sacrifice fill factor. As a result, this work achieves a high reported pixel fill factor (60.4%) and small pitch (e.g., 5 μm) for EH pixels.

Each unit photodiode in the auxiliary array may have a structure similar to that in the pixel array and is placed in its own deep Well. The photo diodes may be configured in series, parallel, or a combination thereof. For example, the photodiodes may be arranged with 2, 3, 4, 5, 6, 7, 8, 9, 10, 11, 12, 13, 14, or 15 in series creating a photo diode string of a desired voltage which then may be in parallel with other photo diode strings to achieve the desired current. The test chip was built with nine photodiodes stacked in series (refer FIG. 32). This stack generates an unregulated auxiliary supply rail ($V_{AUX}$) that can reach about 1.8 V. The diodes are progressively sized (4× to 35×) to compensate for reverse photocurrent loss ($I_{s,leak}$) at the deep-NWell-PSubstrate junctions. This sizing greatly enhances the output drive capability of the $V_{AUX}$ rail.

Figure 5:
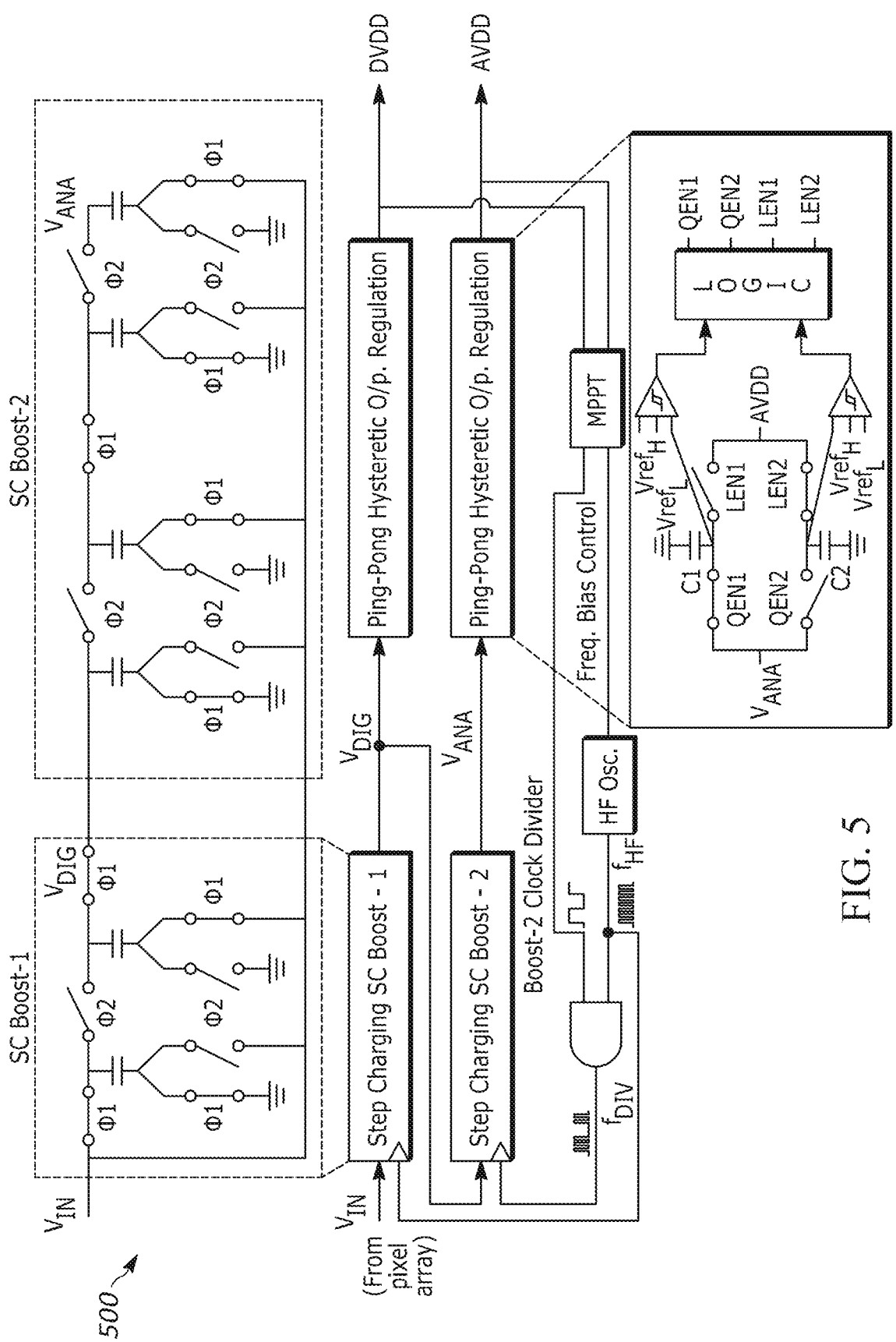
FIG. 5 is a block diagram of an output voltage regulator using a switched capacitor (SC) boost converter with ping-pong hysteretic control.
Figure 6:
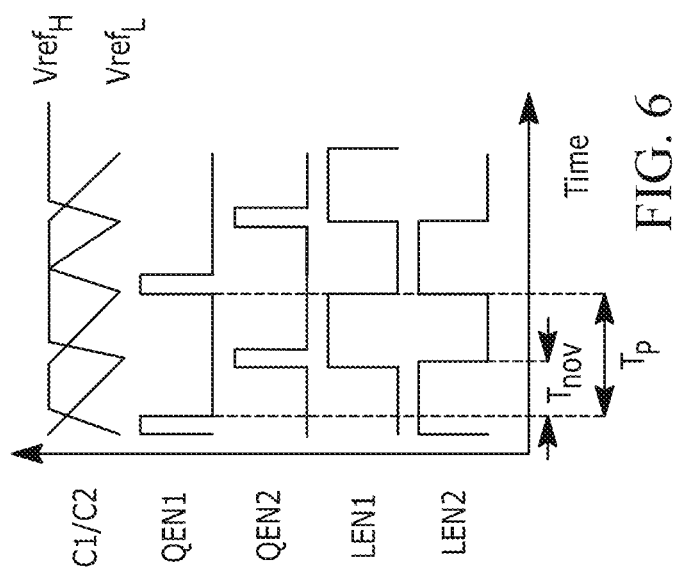
FIG. 6 is a graphical illustration of control signals for the ping-pong hysteretic control of the SC boost converter shown in FIG. 5.

FIG. 5 is a block diagram of an output voltage regulator 500 using switched capacitor (SC) boost converters with ping-pong hysteretic control. The voltage regulator 500 uses a modified Dickson topology for fully integrated SC boost conversion. This topology enables step charging the capacitors to reduce the conduction loss across the switches. The topology also ensures minimal voltage excursions across the top- and bottom-plate parasitic capacitors to reduce losses. The SC Boost-1 and SC Boost-2 converters are daisy-chained to generate the (unregulated) $V_{DIG}$ and $V_{ANA}$ voltages in incremental steps. These outputs are then regulated using hysteretic control to generate $D_{VDD}$ and $A_{VDD}$. SC Boost-1 operates on non-overlapping clocks (φ1 and φ2) at frequency $f_{HF}$, which is provided by a high-frequency oscillator. As SC Boost-2 takes its input from SC Boost-1, it operates on a gated clock with a lower frequency $f_{DIV}$. MPPT control regulates $f_{HF}$ and $f_{DIV}$ to maximize the output power delivered by each stage. FIG. 6 is a graphical illustration of control signals for the SC boost converters shown in FIG. 5.

The test device had a boost converter with 10 stages, each containing 200 pF unit fly capacitors. The converter can be programmed to tap two outputs from any two distinct stages, which provides the flexibility to vary the conversion ratios independently. The $V_{DIG}$ output from SC Boost-1 is nominally tapped after stage 2 and the $V_{ANA}$ output from SC Boost-2 is tapped after stage 6, refer to FIG. 5. The clock of unused stages are turned off to conserve energy.

The voltage regulation occurs through ping-pong hysteretic control. The two output capacitors C1 and C2 buffer the boost converter outputs in opposite phases. When one capacitor delivers energy to the load, the other buffers the boosted output. The charge enable signal QEN1 charges C1, while the load-enable signal LEN2 connects C2 to the load. Likewise, QEN2 and LEN1 begin in-phase once both QEN1 and LEN2 have been disabled. Comparing the voltages across C1 and C2 to $V_{refL}$ and $V_{refH}$ allows for independent control of charge and discharge time.

Depending on the loads at $A_{VDD}$ and $D_{VDD}$, the switching frequency $f_{HF}$ typically ranges from 0.5 to 10 kHz, while the ratio $f_{DIV}/f_{HF}$ varies from 0.75 to 1. The clock generators and drivers for SC boost converter switches are often a major source of energy loss in energy harvesters. This is addressed via an improved Interleaved Ring Oscillator (IRO) design described below.

The chip's oscillators operate between 82 Hz (LF for cold start; see below) and 10 kHz (HF). Here, an ultra-low power Interleaved Ring Oscillator (IRO) that generates two non-overlapping clock phases is disclosed, refer to FIGS. 14 and 15. This IRO draws a current that is proportional to its frequency, owing to a special circuit configuration that minimizes shoot-through currents in its proceeding buffers (which would otherwise lead to a disproportional overhead). The IRO employs two interleaved ring oscillator chains working at the same frequency, but out of phase. Each chain is made up of odd numbered (e.g., five in this embodiment) current-starved stages to control the oscillation frequency. The current sources in each stage are gated to control the phase of charge and discharge. Stage outputs 1-5 and 1'-5' control the gating controls in the other chain. This leads to i and i' (1≤i≤5) being out of phase. To minimize shoot through currents in the buffers following the ring oscillators, specific i and i' nodes are used for power gating. Six gated buffer stages are used to restore small transition times and consume mainly dynamic switching current. Conventional clock drivers follow the gated buffers and drive the boost converter switches.

The measured IRO current consumption of the test device is 2.1 nA/kHz with negligible shoot-through current at the lowest operating frequency of 82 Hz. The current sources that bias the ring oscillator set the oscillator frequency. The non-overlap delay is proportional to the rise and fall times of stage nodes, which relaxes the clock driver requirements.

Here, circuit techniques for generating ultra-low power clock phases for signal processing and power conversion are disclosed. The disclosure describes generating non-overlapping clocks over a very wide frequency range at very low power consumption.

Most signal processing or power conversion ICs use switched capacitor or inductor circuits, however in energy-constrained applications like energy harvesting devices, wireless senor nodes or implantable devices, one of the significant sources of energy consumption is generating these non-overlapping clocks. In these applications and others, the clock generator needs to operate over a wide range of frequencies depending on the mode of operation or available power.

Figure 7:
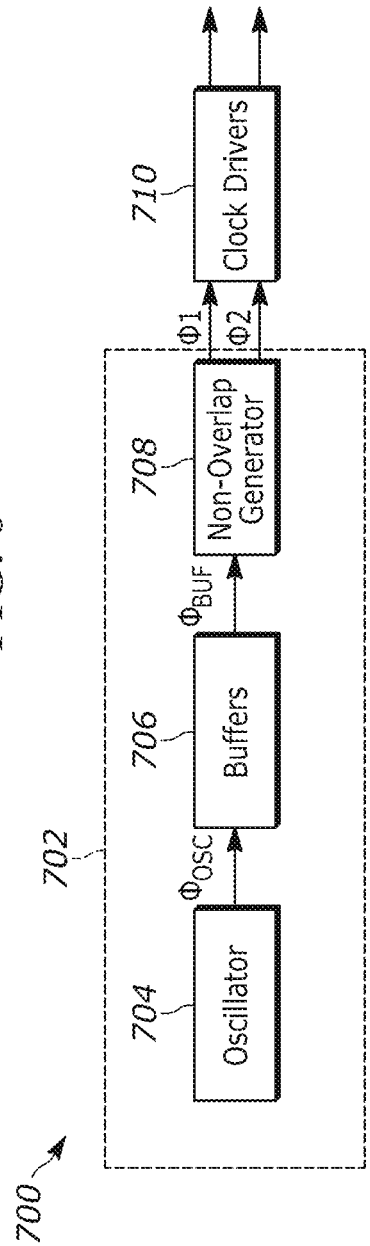
FIG. 7 is a block diagram of a non-overlap clock phase generator.
Figure 8:
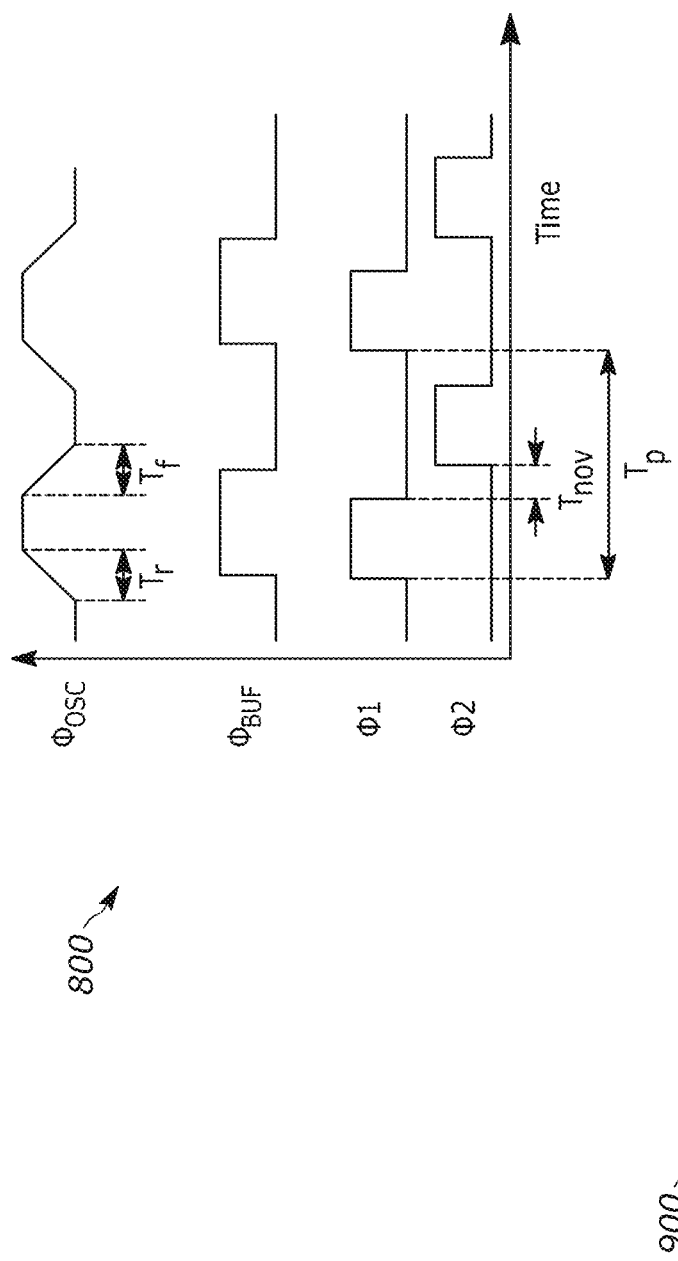
FIG. 8 is a graphical illustration of control and intermediate signals of the non-overlap clock phase generator of FIG. 7.

Conventional on-chip non-overlap clock generator is made of the blocks in the dashed rectangle followed by clock drivers indicated in FIGS. 7 and 8.

FIG. 7 is a block diagram of a non-overlap clock phase generator 700. The clock generator 700 includes an oscillator 702, buffers 706, a two phase non-overlapping generator 708 and clock drivers 710. FIG. 8 is a graphical illustration of control and intermediate signals of the non-overlap clock phase generator of FIG. 7.

Figure 9:
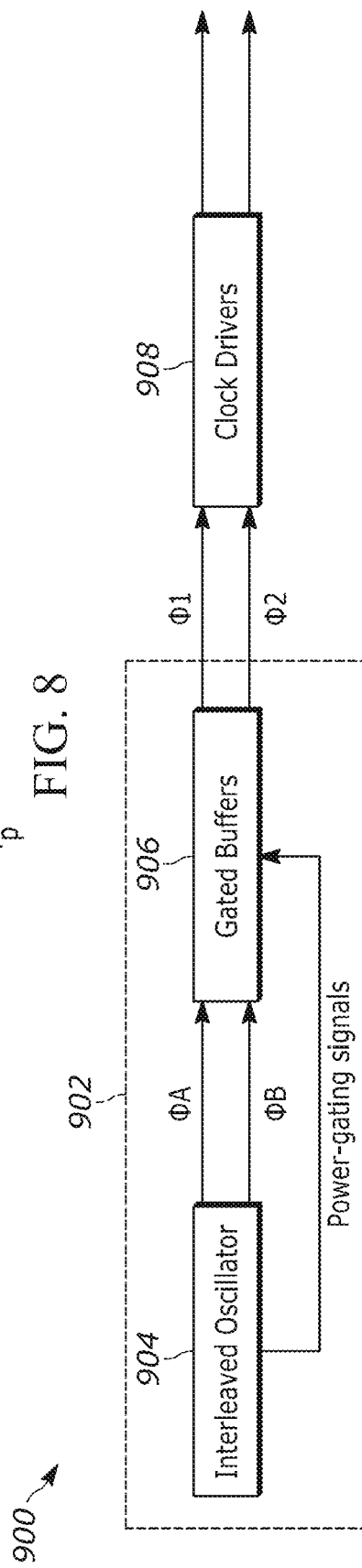
FIG. 9 is a block diagram of a clock generator using interleaved oscillator with power gated buffers.

FIG. 9 is a block diagram of a clock generator 900 with a buffered two-phase interleaving oscillator 902. The buffered two-phase interleaving oscillator 902 includes an interleaved oscillator 904 with power gated buffers 906. The buffered two-phase interleaving oscillator 902 provides input to clock drivers 908.

Figure 10:
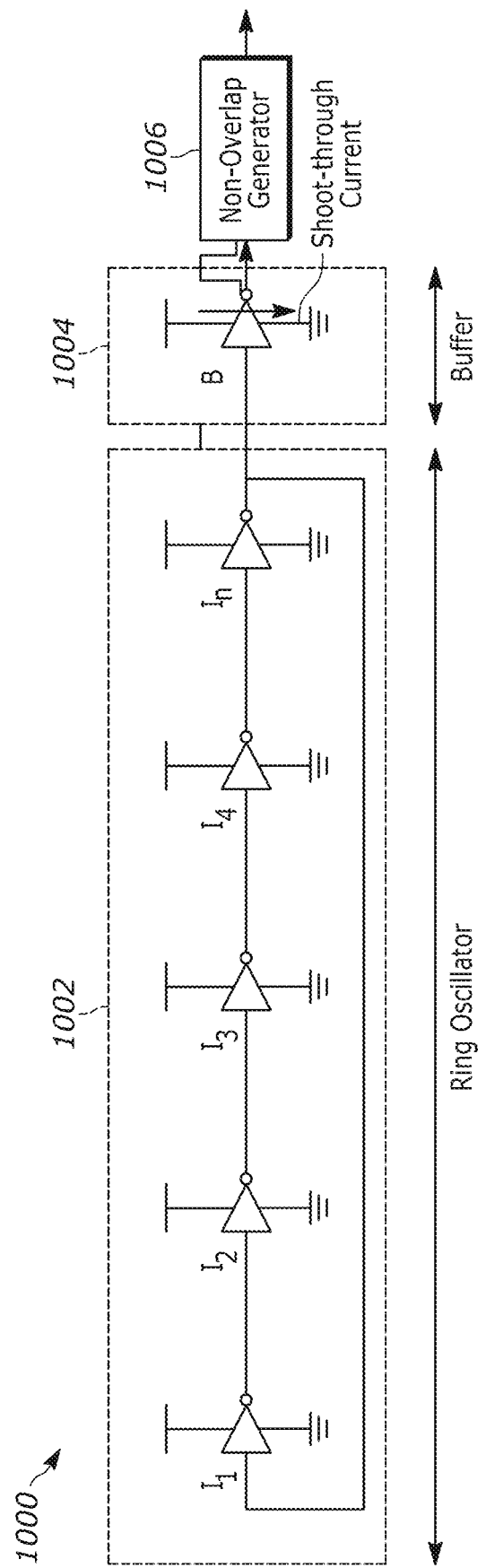
FIG. 10 is a block diagram of buffered high speed ring oscillator.

FIG. 10 is a block diagram of buffered high speed ring oscillator 1000. The buffered high speed ring oscillator 1000 includes a ring oscillator 1002, buffers 1004, and a non-overlapping generator 1006. The ring oscillator 1002 is shown as 5 stage ring oscillator, however the ring oscillator may be any odd number of stages, such as a 5, 7, 9, 11, 21, 31, 41, 51, etc. Also, the buffers 1004 is shown as a single buffer, however this may be implemented as multiple buffers arranged in series or parallel or a combination thereof.

A current starved ring oscillator or relaxation oscillator is often employed to generate variable frequency clocks at lower power. When the clock frequency is reduced beyond a certain limit, the rise time ($T_r$) and fall time ($T_f$) of the oscillator output ($\phi_{OSC}$) increases. This results in higher shoot-through current in the buffers following the oscillator and any reduction in power obtained by reducing the oscillator frequency can be lost.

Figure 11:
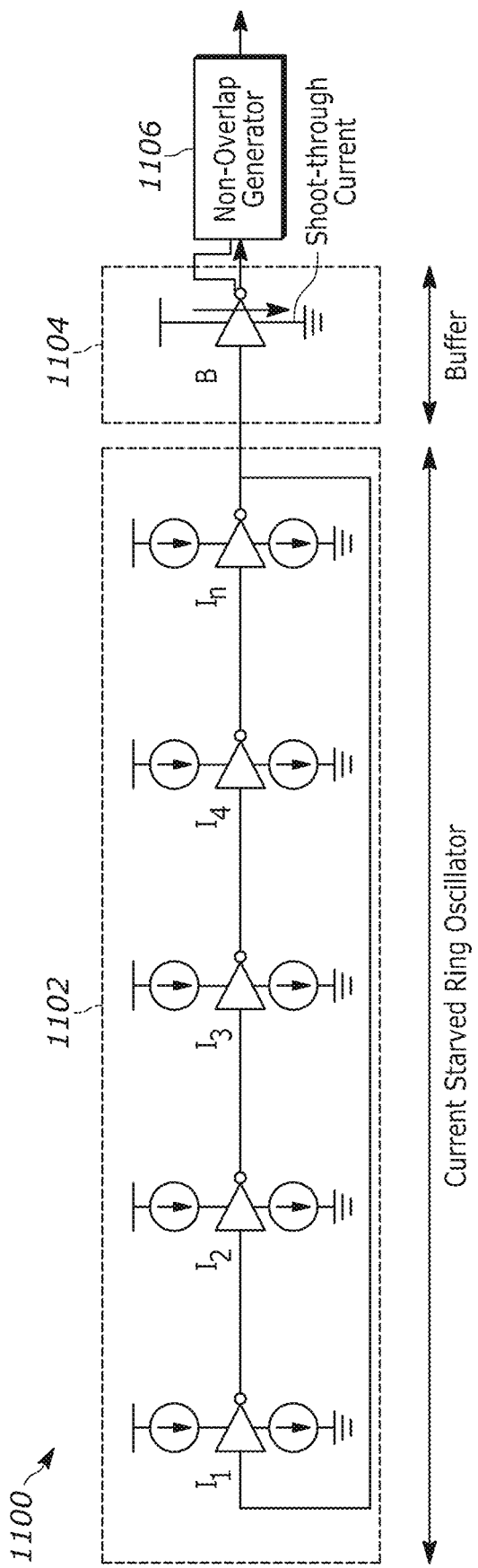
FIG. 11 is a block diagram of buffered high speed current starved ring oscillator.

FIG. 11 is a block diagram of buffered current starved high speed ring oscillator 1100. The buffered high speed ring oscillator 1100 includes a ring oscillator 1102, buffers 1104, and a non-overlapping generator 1106. The ring oscillator 1102 is shown as 5 stage ring oscillator, however the ring oscillator may be any odd number of stages, such as a 5, 7, 9, 11, 21, 31, 41, 51, etc. Also, the buffers 1104 is shown as a single buffer, however this may be implemented as multiple buffers arranged in series or parallel or a combination thereof.

To reduce the number of clock drivers and repeaters in the chip, the non-overlap period ($T_{nov}$), e.g., FIG. 8, must be large when the input supply power is limited. This non-overlap period depends on the delay introduced in the non-overlap generator. Conventionally, increasing the length of the delay also increases power consumption of the non-overlap generator, e.g., FIGS. 12A and 12B.

To overcome these significant issues at lower supply powers, we propose a new interleaved oscillator to generate non-overlapping clocks ($\phi$A and $\phi$B) without the need of extra non-overlap generator circuits. The non-overlap period increases as frequency reduces, thereby enabling reduced clock drivers in energy-constrained applications. To reduce the rise and fall times of the clocks, we propose new power gated buffers to avoid the shoot through current.

A conventional ring oscillator has odd number of inverter stages. The oscillator output is buffered before being driven by clock drivers. To reduce the power through the oscillator, the inverters in the oscillator are made weaker (smaller W/L size). This increases the rise and fall times of the ring oscillator output causing large shoot-through current in the buffer.

A current starved ring oscillator is used to tune the frequency using a programmable current source in series with the inverters. As shown in FIG. 11, the output of the current starved oscillator also has large rise and fall times to achieve low frequency clocks. However, at lower frequencies, the shoot-through current in the buffers following current starved ring oscillator dominate the total power consumption.

Figure 12A:
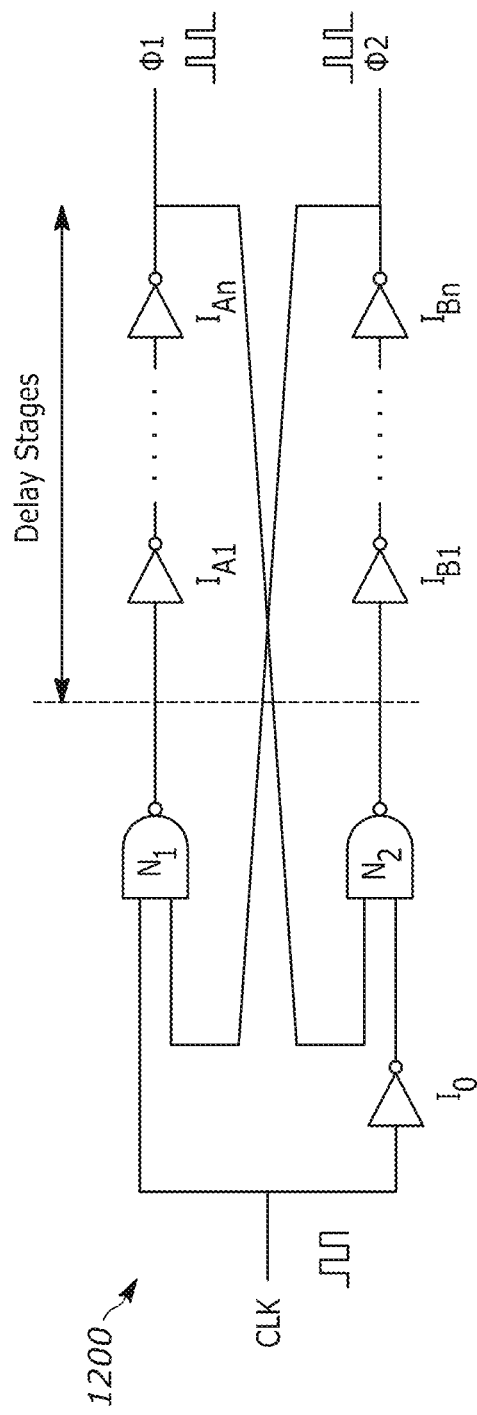
FIG. 12A is a block diagram of a first exemplary non-overlap two phase clock generator with a frequency independent delay.
Figure 12B:
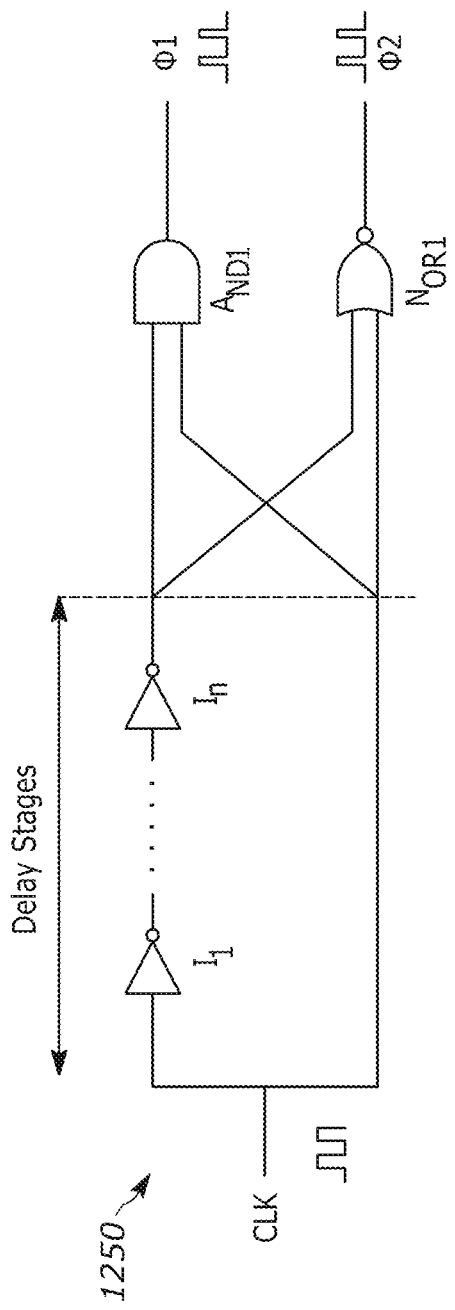
FIG. 12B is a block diagram of a second exemplary non-overlap two phase clock generator with a frequency independent delay.

FIG. 12A is a block diagram of a first exemplary CMOS logic circuit non-overlap two phase clock generator 1200 with a frequency independent delay. FIG. 12B is a block diagram of a second exemplary CMOS logic circuit non-overlap two phase clock generator 1250 with a frequency independent delay. Here the delay stages $I_{A1}$ to $I_{AN}$, $I_{B1}$ to $I_{BN}$, and $I_1$ to $I_N$ may be any number of inverters or similar logic structure.

For low power, low frequency applications, it is desirable to have larger non-overlap phases. This enables using reduced number of buffer stages while tolerating larger clock skew. However, larger delays come at the cost of power consumption in these delay stages.

For high frequency clock generated from the current starved ring oscillator, the rise and fall times are small and hence, smaller non-overlap phase is sufficient to ensure two-phase operation. Smaller non-overlap phase ensures larger on-time in high frequency applications. This improves transient settling behavior in switched capacitor or inductor circuits.

Hence, it would be desirable to have delay between the non-overlap clock phases proportional to its frequency.

Figure 13:
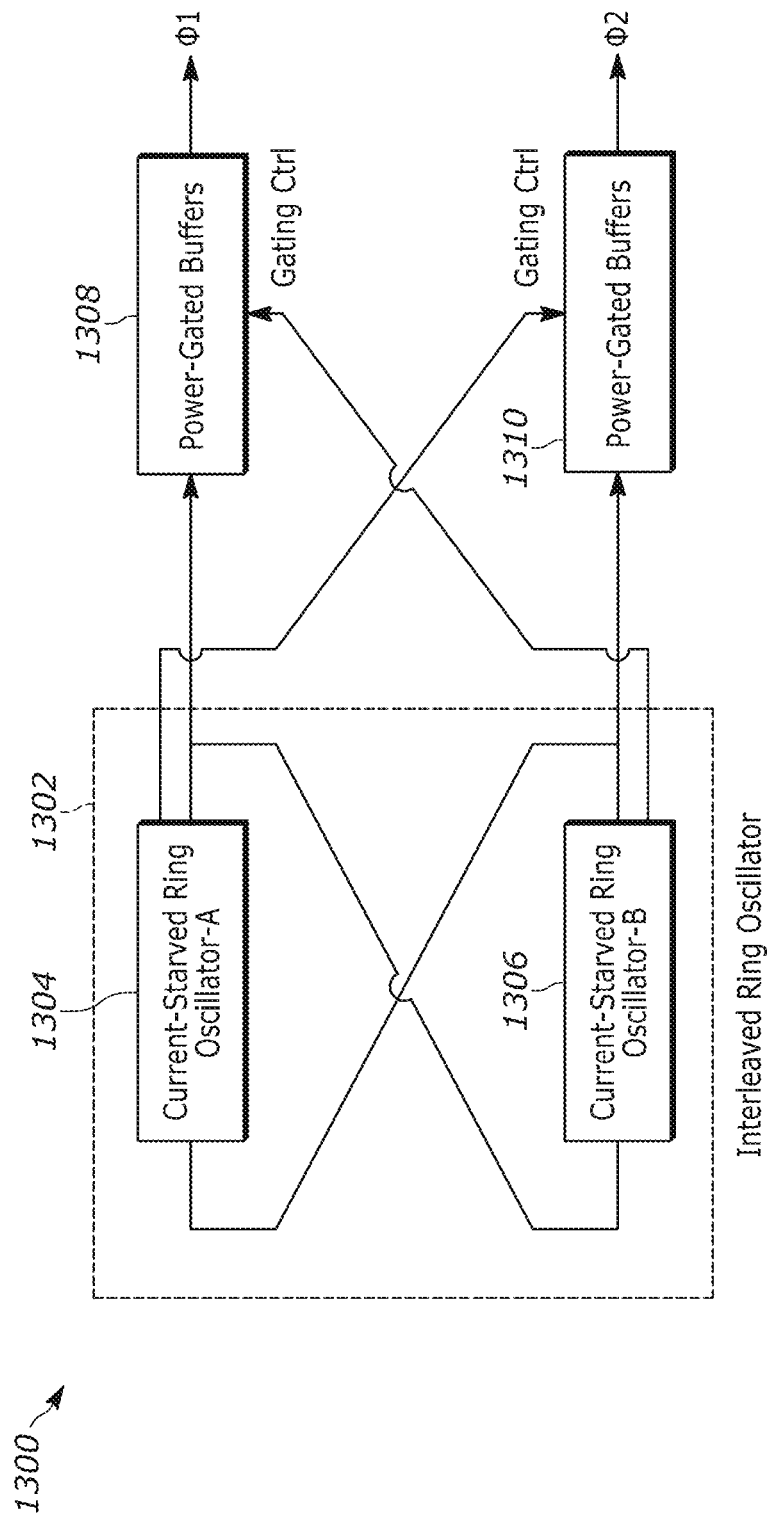
FIG. 13 is a block diagram of a two phase clock generator with interleaved ring oscillators.

FIG. 13 is a block diagram of a two phase clock generator 1300 with interleaved ring oscillators 1302. The interleaved ring oscillator 1302 includes a first current starved ring oscillator 1304 and a second current starved rind oscillator 1306 which are coupled such that the output of the first current starved ring oscillator 1304 is an input to the second current starved rind oscillator 1306, and the second current starved ring oscillator 1306 is an input to the first current starved rind oscillator 1304. The first current starved ring oscillator 1304 and the second current starved rind oscillator 1306 send a signal to power gated buffers 1308 and 1310. The output of the first current starved ring oscillator 1304 is an input to the first power gated buffer 1308 and gating control for the first power gated buffer 1308 is the output of the second current starved ring oscillator 1306. Similarly, the output of the second current starved ring oscillator 1306 is an input to the second power gated buffer 1310 and gating control for the second power gated buffer 1310 is the output of the first current starved ring oscillator 1304. The time-period or clock frequency may be based on the programmable current source in the current starved inverters.

Interleaving ring oscillators help generate clock phases at half the original phase difference. These intermediate clock phases are used as gating control signals to prevent the shoot-through current in the power-gated buffers as shown in FIG. 13.

Once, the edges of clocks are sharp enough after a few stages of power-gated buffers, regular buffers or clock drivers help drive the non-overlapping clocks.

This approach also inherently introduces delays between the clock phases that are also proportional to frequency. Thus, low-power low-frequency operations can be implemented using fewer clock repeater stages.

At higher available power, clock frequency can be increased depending on the mode of operation with smaller non-overlap period. This feature helps improve settling of switched capacitor voltages.

Figure 14:
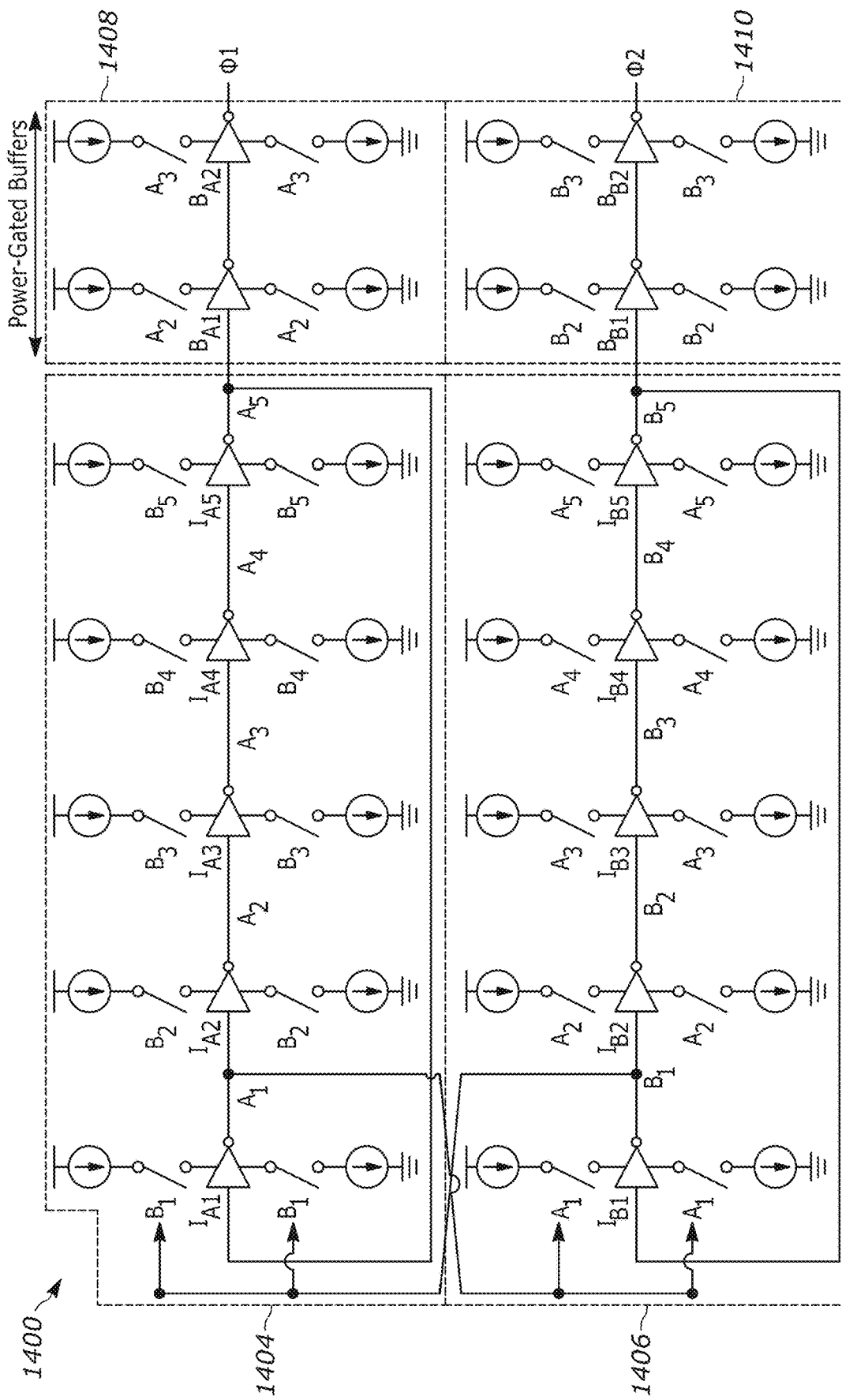
FIG. 14 is a block diagram of interleaved current-starved ring oscillators with power-gated buffers.

FIG. 14 is a block diagram of interleaved current-starved ring oscillators with power-gated buffers system 1400. The interleaved ring oscillator 1402 includes a first current starved ring oscillator 1404 and a second current starved rind oscillator 1406 which are coupled such that the output of the 1$^{st}$ stage first current starved ring oscillator 1404 gates the 1$^{st}$ stage second current starved ring oscillator 1406, and the 1$^{st}$ stage second current starved ring oscillator 1406 gates the 1$^{st}$ stage first current starved rind oscillator 1404. The third current starved ring oscillator 1404 and the second current starved rind oscillator 1406 send a signal to power gated buffers 1408 and 1410. The output of the first current starved ring oscillator 1404 is an input to the first power gated buffer 1408 and gating control for the first power gated buffer 1408 is the output of the second current starved ring oscillator 1406. Similarly, the output of the second current starved ring oscillator 1406 is an input to the second power gated buffer 1410 and gating control for the second power gated buffer 1410 is the output of the first current starved ring oscillator 1404.

The ring oscillator 1404, 1406 are shown as 5 stage ring oscillator, however the ring oscillators may be any odd number of stages, such as a 5, 7, 9, 11, 13, 15, 19, 21, 31, 41, 51, etc. Also, the buffers 1108, 1410 are shown as a double buffer, however this may be implemented as multiple buffers arranged in series or parallel or a combination thereof.

Also, each internal stage of the first ring oscillator 1404 is interleaved and is used to gate the internal stages of the second ring oscillator 1406, and each internal stage of the second ring oscillator 1406 is interleaved and is used to gate the internal stages of the first ring oscillator 1404. For example, the output $A_1$ to the first inverter stage of the first ring oscillator $I_{A1}$ it used to gate the first inverter stage of the second ring oscillator $I_{B1}$, and the output $B_1$ to the first inverter stage of the second ring oscillator $I_{B1}$ it used to gate the first inverter stage of the first ring oscillator $I_{A1}$. This continues with each stage of each ring oscillator.

The power consumed by the interleaved ring oscillator and power-gated buffers was seen to scale linearly with the clock frequency which is indicative that there is no shoot-through current even at very low clock frequencies. Also, the power of the non-overlap clock phase generator was seen to scales linearly with supply voltage.

FIG. 14 shows two interleaved current starved ring oscillators each with 5 stages. The current sources in each stage help control the frequency.

Each of the current-starved inverters in the ring oscillator-A is gated by the switching outputs (B1-B5) of corresponding inverters in oscillator-B respectively. Likewise, inverters in oscillator-B are gated by switching outputs (A1-A5) from oscillator-A respectively.

These interleaving ring oscillators produce clock phases that are 18° out of phase of each other and create a output 180 degrees out of phase. The outputs from these oscillators have same frequency.

Taking the outputs from nodes A5 and B5, we get non-overlapping clocks in opposite phases. However, the rise and fall times are very large transition times at low clock frequencies.

These large transition times would have led to large shoot through current in subsequent buffers. We resolved this issue using power-gated buffers. The power-gating signal for the buffers was selected to be one of suitable oscillator phases A1-A5 and B1-B5 already generated. This is shown in FIG. 14 in which the first power gated buffer $B_{A1}$ is gated by the output of the second inverter stage of the first ring oscillator $I_{A2}$, and the first power gated buffer $B_{B1}$ is gated by the output of the second inverter stage of the second ring oscillator $I_{B2}$. In this example, a second power gated buffer was used in which the second power gated buffer $B_{A2}$ is gated by the output of the third inverter stage of the first ring oscillator $I_{A3}$, and the second power gated buffer $B_{B2}$ is gated by the output of the third inverter stage of the second ring oscillator $I_{B3}$.

As an example, if A5 is rising, the output of the first inverter following it is going to transition from high→low. Hence, to avoid shoot-through current in that inverter, it is gated by clock phase B2. This leads to outputs with lower transition times without any shoot-through current penalty.

Generating sharper clock phases in this way leads to clocks with non-overlap period that is proportional to the slow rise and fall times of the interleaved ring oscillator. At lower supply voltage levels and lower clock frequency, we obtain larger non-overlap period. On the other hand, at faster clock frequency, the non-overlap period is reduced.

Figure 15:
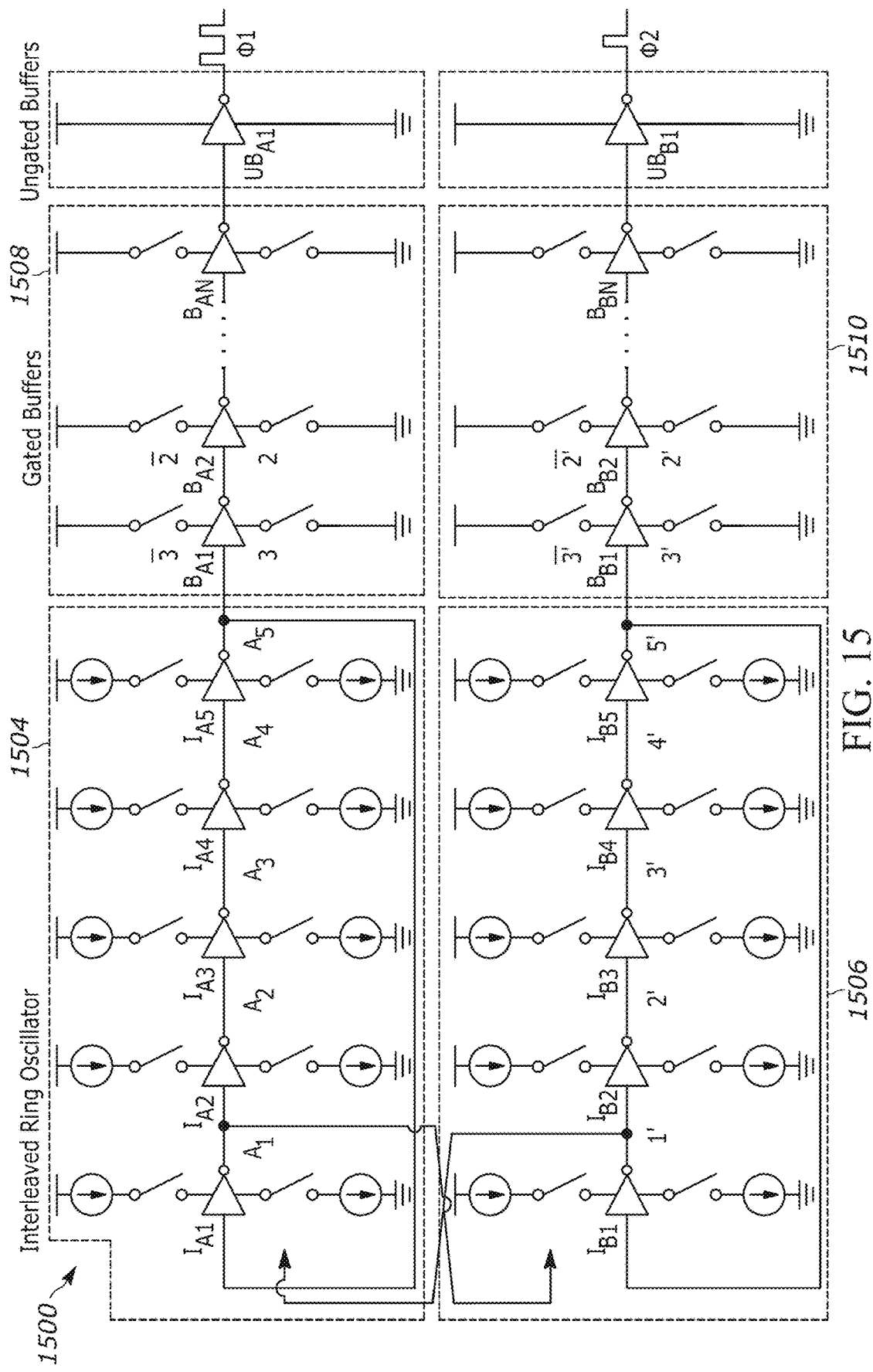
FIG. 15 is a block diagram of interleaved current-starved ring oscillators with power-gated buffers and ungated buffers.

FIG. 15 is a block diagram of interleaved current-starved ring oscillators with power-gated buffers and ungated buffers system 1500.

FIG. 15 is a block diagram of interleaved current-starved ring oscillators with power-gated buffers system 1500. The interleaved ring oscillator 1502 includes a first current starved ring oscillator 1504 and a second current starved rind oscillator 1506 which are coupled such that the output of the 1$^{st}$ stage first current starved ring oscillator 1504 gates the 1$^{st}$ stage second current starved ring oscillator 1506, and the 1$^{st}$ stage second current starved ring oscillator 1506 gates the 1$^{st}$ stage first current starved rind oscillator 1504. The third current starved ring oscillator 1504 and the second current starved rind oscillator 1506 send a signal to power gated buffers 1508 and 1510. The output of the first current starved ring oscillator 1504 is an input to the first power gated buffer 1508 and gating control for the first power gated buffer 1508 is the output of the second current starved ring oscillator 1506. Similarly, the output of the second current starved ring oscillator 1506 is an input to the second power gated buffer 1510 and gating control for the second power gated buffer 1510 is the output of the first current starved ring oscillator 1504.

Regular clock driver buffers increase the driving strength of these non-overlapping clocks. A simple state machine with multiplexers to pass one of the two clocks can generate any number of non-overlapping clock phases as shown in FIG. 16.

Figure 16:
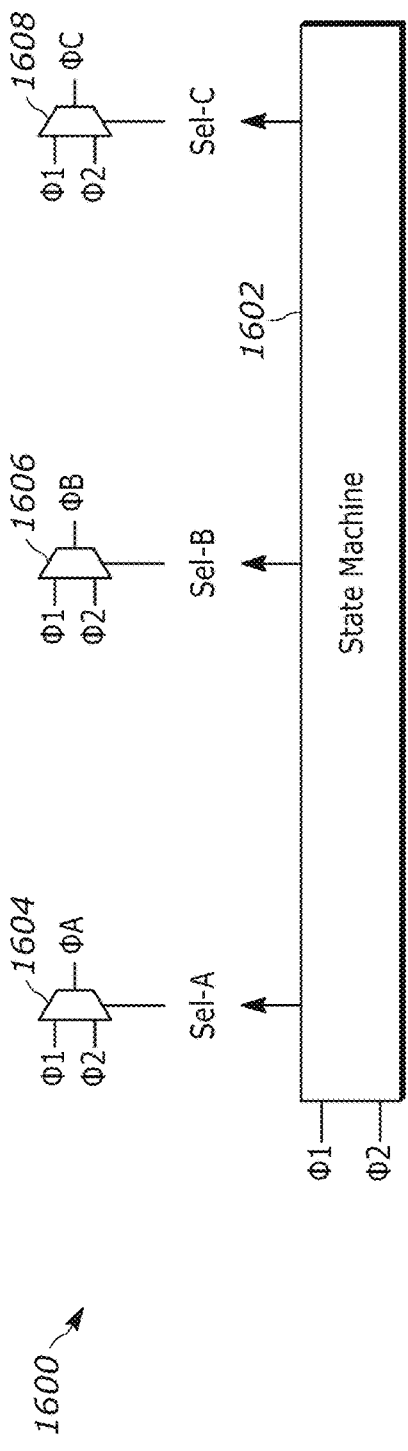
FIG. 16 is a block diagram of state machine based multiple non-overlapping clock phase generator.

FIG. 16 is a block diagram of state machine based multiple non-overlapping clock phase generator 1600. The clock generator includes a state machine 1602 and multiplexers. In this exemplary block diagram, there are three multiplexers (a first multiplexer 1604, a second multiplexer 1606, and a third multiplexer 1608) used to create a three phase clock. However more or less multiplexers can be used to generate a desired number of phases. For example, if only two phases are needed then only a first multiplexer 1604, a second multiplexer 1606 would be needed and the third multiplexer 1608 could be removed. If more phases are needed then additional multiplexers could be added.

An energy harvester has a transducer that converts physical energy like vibration, light or temperature difference to electrical energy. This electrical energy is often generated at a voltage that is different from the voltage required to charge the battery or a capacitor. A switching voltage converter is generally used to step up/down the voltage.

Tracking maximum output power under varying inputs is challenging in energy constrained applications. This disclosure outlines an analog maximum output power tracking scheme that regulates the switching frequency of the voltage regulator using hill climbing (also known as perturb and observe) algorithm at a very low energy. The proposed method adjusts the switching frequency to vary the input and output impedances of the voltage regulator. This impedance matching helps deliver maximum power output from the harvester.

Energy harvesting systems generally regulate output voltage with hysteretic control due to its simplicity and low power implementation. This disclosure describes an improved modified hysteretic control with higher efficiency that also provide the control signals for tracking output power.

A typical energy harvesting system has a transducer that converts physical energy like light, pressure or heat to electrical energy. The electrical energy from the transducer is produced at a voltage $V_{IN}$. This needs to be stepped up/down before it can be delivered to the load $R_{LOAD}$ or stored in a capacitor $C_{LOAD}$.

Figure 17:
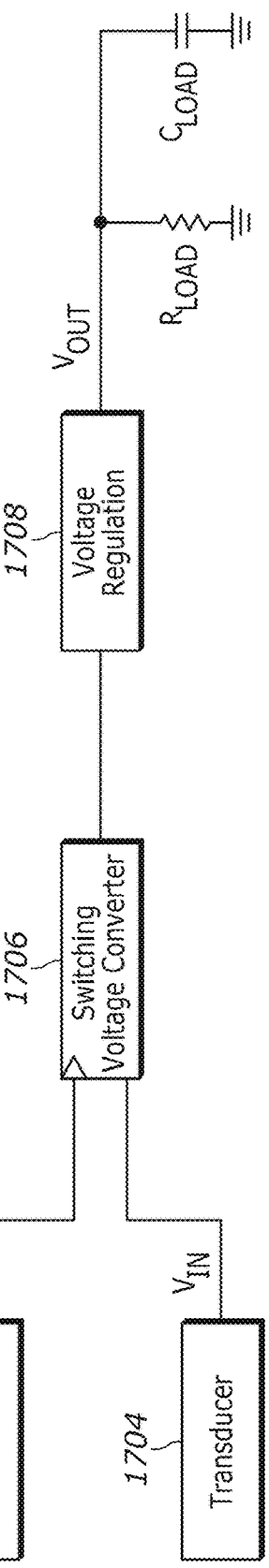
FIG. 17 is a block diagram of an energy harvesting system.

FIG. 17 is a block diagram of an energy harvesting system 1700. The energy harvesting system 1700 includes a clock generator 1702, a transducer 1704, a switching voltage converter 1706, a voltage regulator 1708, and a load having a resistance load $R_{LOAD}$ and/or a capacitance $C_{LOAD}$. The transducer 1704 includes an imaging sensor, microphone, humidity sensor, pressure sensor, infrared sensor, magnetic sensor, temperature sensor, or a combination thereof.

A switching voltage converter delivers output power regulated at voltage $V_{OUT}$. The converter needs clocks to turn its switches on and off periodically. Changing the switching frequency or duty cycle, regulates the power delivered to the load from the source. A feedback loop senses the output power and modulates the switching frequency or duty cycle as shown in FIG. 18.

Figure 18:
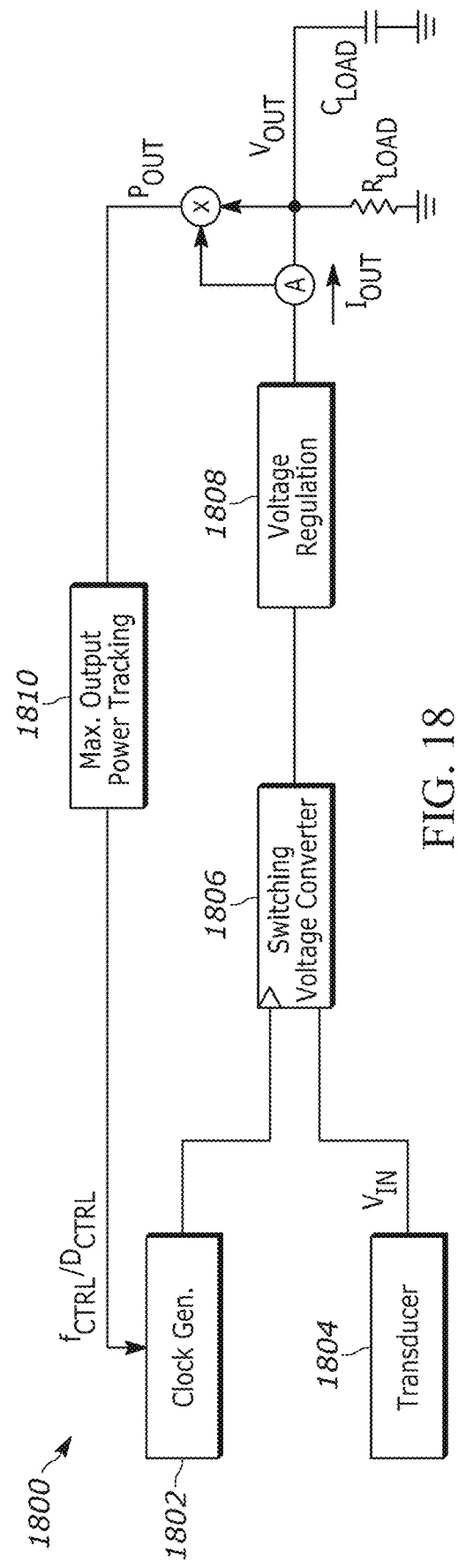
FIG. 18 is a block diagram of a maximum output power tracking regulator controlling switching frequency or duty cycle.

FIG. 18 is a block diagram of an energy harvesting system 1800 with a switching frequency regulator. The energy harvesting system 1800 includes a clock generator 1802, a transducer 1804, a switching voltage converter 1806, a voltage regulator 1808, a load having a load resistance $R_{LOAD}$ and/or a load capacitance $C_{LOAD}$, and a Maximum output power tracking module 1810. The transducer 1804 includes an imaging sensor, microphone, humidity sensor, pressure sensor, infrared sensor, magnetic sensor, temperature sensor, or a combination thereof.

Sensing output power requires sensing output voltage and current and getting its product to adjust the switching frequency. This is extremely challenging in an energy constrained applications like energy harvesting from ambient sources.

Figure 19:
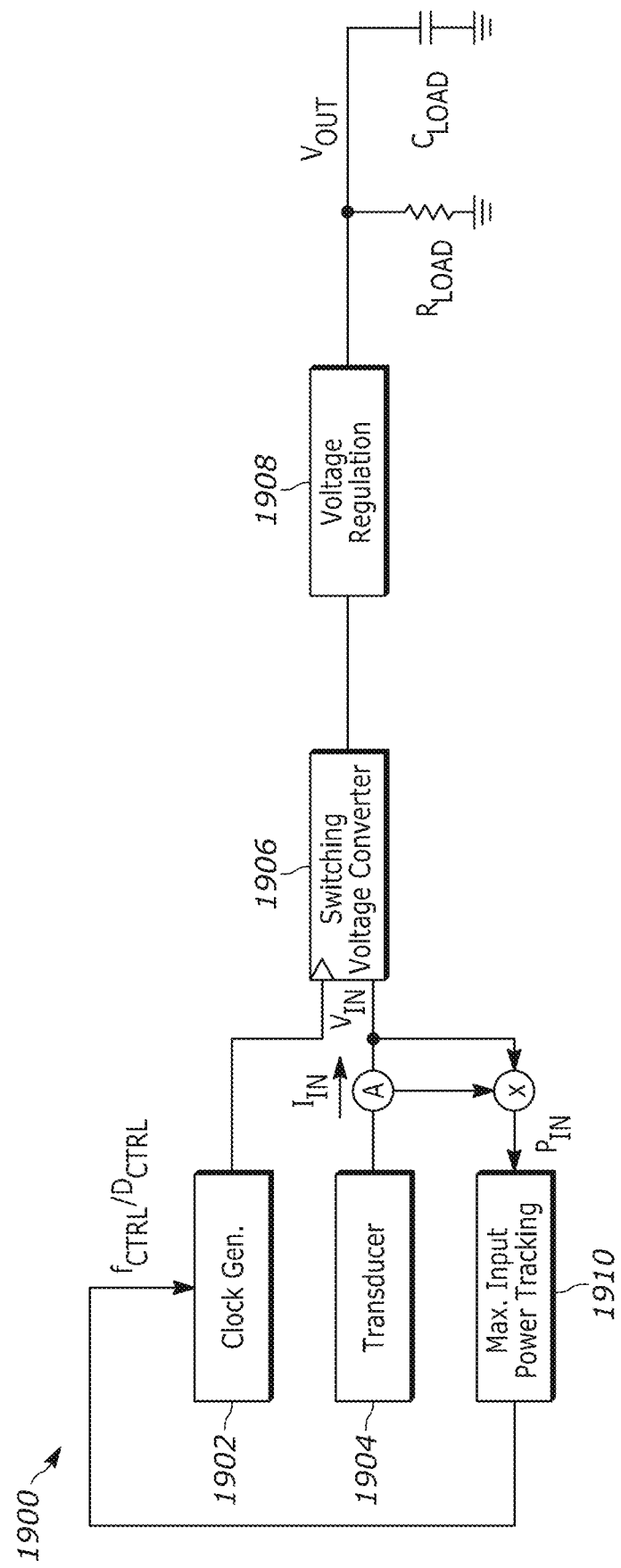
FIG. 19 is a block diagram of an alternative embodiment of a maximum input power tracking regulator controlling switching frequency or duty cycle.

A way to maximize power in an energy harvesting system is shown in FIG. 19. FIG. 19 is a block diagram of an energy harvesting system 1900 with a switching frequency regulator. The energy harvesting system 1900 includes a clock generator 1902, a transducer 1904, a switching voltage converter 1906, a voltage regulator 1908, a load having a load resistance $R_{LOAD}$ and/or a load capacitance $C_{LOAD}$, and a Maximum output power tracking module 1910. The transducer 1904 includes an imaging sensor, microphone, humidity sensor, pressure sensor, infrared sensor, magnetic sensor, temperature sensor, or a combination thereof.

Each source has a definite characteristic in its region of operation where its power can be maximized. For example, a thermoelectric generator (TEG) delivers maximum power when the voltage across it is half the voltage under no-load condition. Likewise, a photoelectric cell or solar cell delivers maximum power when the voltage across it is around 0.8 times the voltage under no-load condition.

A simple and relatively low-power implementation of measuring the source voltage under no-load condition leads to the feedback control system shown in FIG. 19. Regulating the voltage ($V_{IN}$) delivered by the source by controlling the switching frequency or duty cycle enables maximum power extraction from the source.

Figure 20:
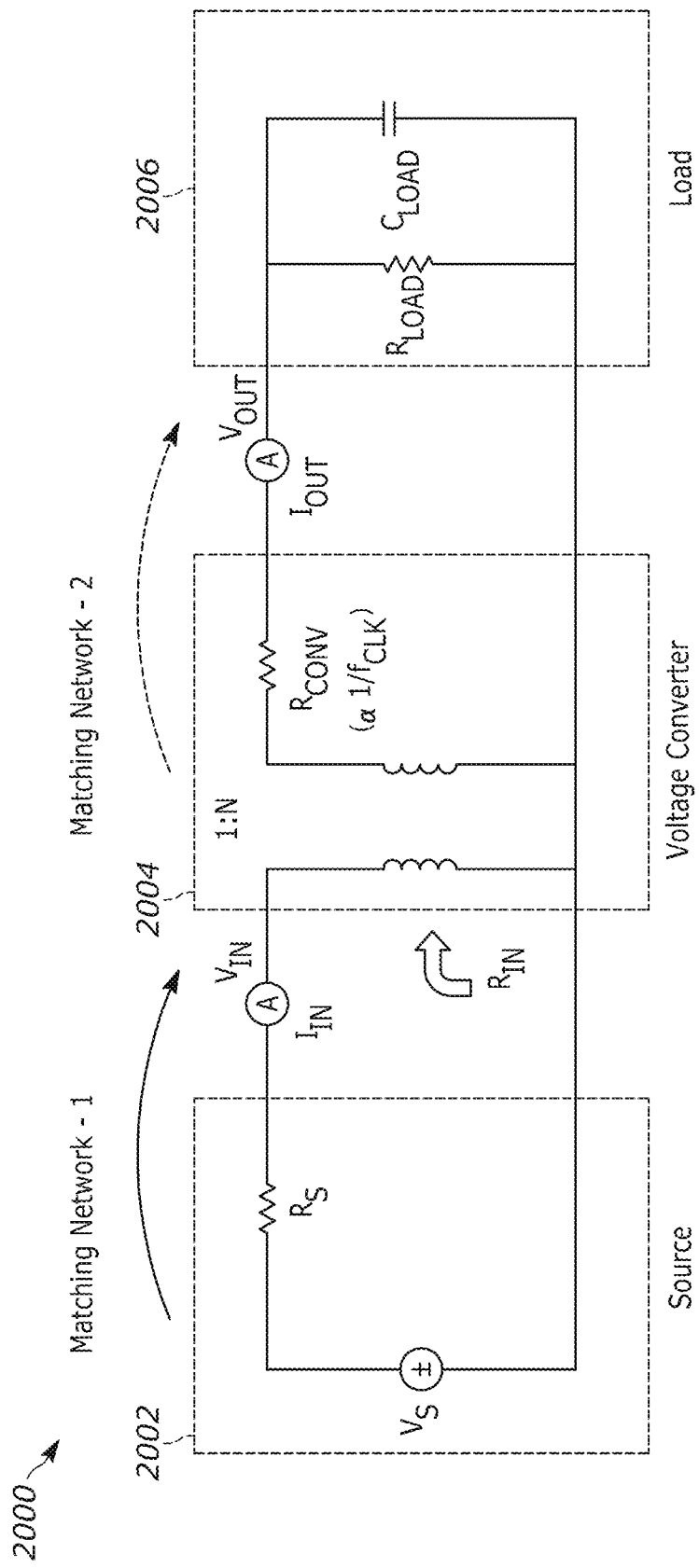
FIG. 20 is a schematic diagram of a system model of a switching frequency regulator.

The functioning of this system can be better described from the overall system model shown in FIG. 20. FIG. 20 is a schematic diagram of a system model 2000 of a switching frequency regulator. The transducer source 2002 can be modelled as a Thevenin voltage source Vs with an equivalent impedance $R_S$. The switching voltage converter 2004 is modelled as a voltage converter with a ratio 1:N and an equivalent output impedance that is inversely proportional to switching frequency $f_{CLK}$. And the load 2006 is modeled as a load resistance $R_{LOAD}$ and a load capacitance $C_{LOAD}$.

Controlling the frequency or duty cycle of the clock, the impedance looking into the converter ($R_{IN}$) is modulated such that $V_{IN}$ becomes some fraction of Vs depending on the energy source. Under such a condition, $R_{IN}$ becomes equal to $R_S$ and maximum power is extracted from the energy source. Thus, optimizing the clock to have impedance matching in matching network-1 lead to sub-optimal operation of matching network-2. This results in lower overall power output from the voltage converter.

This disclosure relates to regulating the clock to maximize the overall power output from the voltage converter. The primary advantage of this scheme is that it enables maximum power delivered from an energy harvesting system and is not limited to extraction of maximum power from the source. A few novel points include:

Some key aspects of this maximum power tracking system include:

This system can measure and maximize the output power in energy constrained applications like energy harvesting, yet the implementation is not limited to maximizing power from the energy source.

A method to sense output power by measuring current from an output voltage regulator while consuming very low energy is achieved.

The current measurement from voltage regulator does not need a series resistor or a replica generation. The current output from the voltage regulator is measured by measuring the charging time of an intermediate capacitor in the voltage regulator.

The charging time of the intermediate capacitor is measured by converting a small bias current to a corresponding voltage and using a voltage regulator to compare the charging times at different clocks.

A new multiplexed ping-pong hysteretic output voltage regulator scheme is disclosed that improves the efficiency but maintains the simplicity of conventional hysteretic control.

Figure 21:
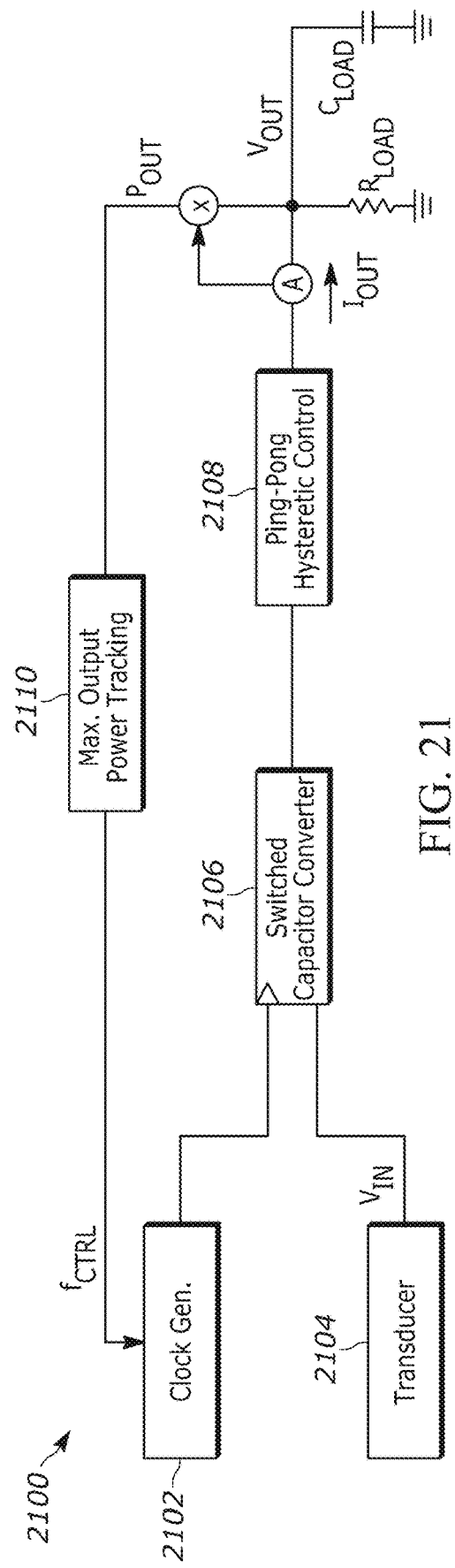
FIG. 21 is a block diagram of a regulator with a switched capacitor converter, maximum output power tracking regulator, and ping-pong hysteretic controller.

FIG. 21 is a block diagram of a system 2100 with a regulator having a switched capacitor converter and ping-pong hysteretic control. The energy harvesting system 2100 includes a clock generator 2102, a transducer 2104, a switching voltage converter 2106 such as a switched capacitor converter, a ping-pong hysteretic control voltage regulator 2108, a load having a load resistance $R_{LOAD}$ and/or a load capacitance $C_{LOAD}$, and a Maximum output power tracking module 2110. The transducer 2104 includes an imaging sensor, microphone, humidity sensor, pressure sensor, infrared sensor, magnetic sensor, temperature sensor, or a combination thereof.

In one embodiment, the system 2100 is a fully integrated switched capacitor converter with hysteretic control. We regulate the output power by changing the switching frequency of the switched capacitor converter 2106. The output voltage is regulated using a new ping-pong hysteretic controller 2108 which can improve the efficiency in the voltage regulator. The techniques described here are not limited to the type of voltage regulator. The feedback control variable is also not limited to the switching frequency and can include duty cycle or any other variable with which the voltage regulator's impedance can be controlled. The output power is a product of the output voltage and current which can be represented as equation 1.

$$Pout = Vout * Iout \qquad (1)$$

Figure 22:
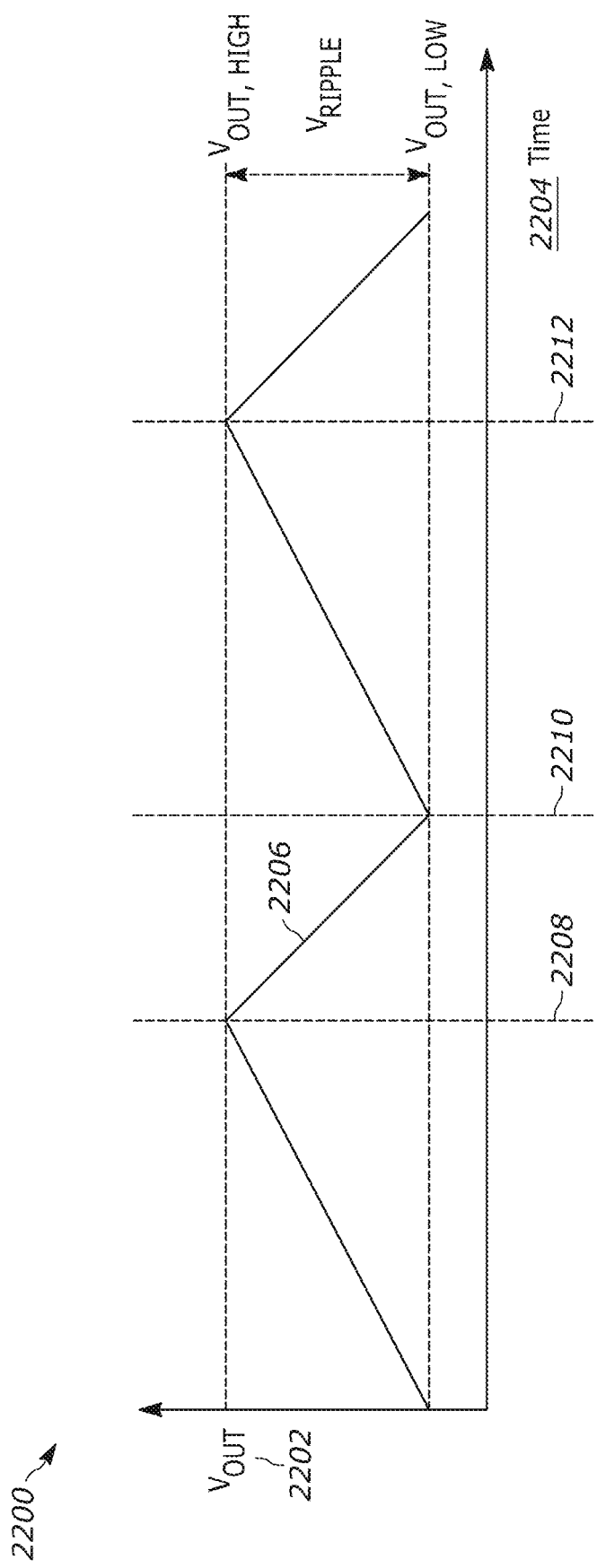
FIG. 22 is a graphical representation of output voltage of a regulator with a switched capacitor converter and ping-pong hysteretic control with respect to time.

The ability to sense an output voltage and an output current to determine the product is challenging for low energy systems. The output voltage is regulated within a hysteretic band as shown in FIG. 22. FIG. 22 is a graphical representation 2200 of output voltage 2202 of a regulator with a switched capacitor converter and ping-pong hysteretic control with respect to time 2204. In this graphical representation 2200, the output voltage waveform 2206 ping-pongs between high output voltage at time 2208 and a low output voltage at time 2210 with a period between times 2208 and 2212.

The ripple voltage on $V_{OUT}$ (=$V_{OUT,HIGH}$-$V_{OUT,LOW}$) is designed to be small, with the output voltage remaining mostly constant and hence, the output power is proportional to output current. To maximize output power, the output current from the converter needs to be maximized.

To sense the output current, a current is measured by measuring the voltage across a series resistor or using a replica current mirror. However, these require additional circuits and consume power to sense the current.

Figure 23A:
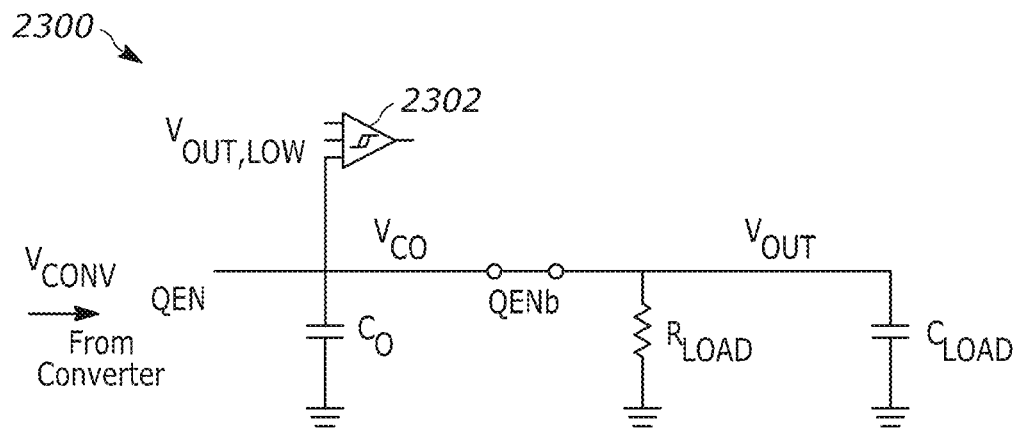
FIG. 23A is a schematic diagram of a hysteretic controller.
Figure 23B:
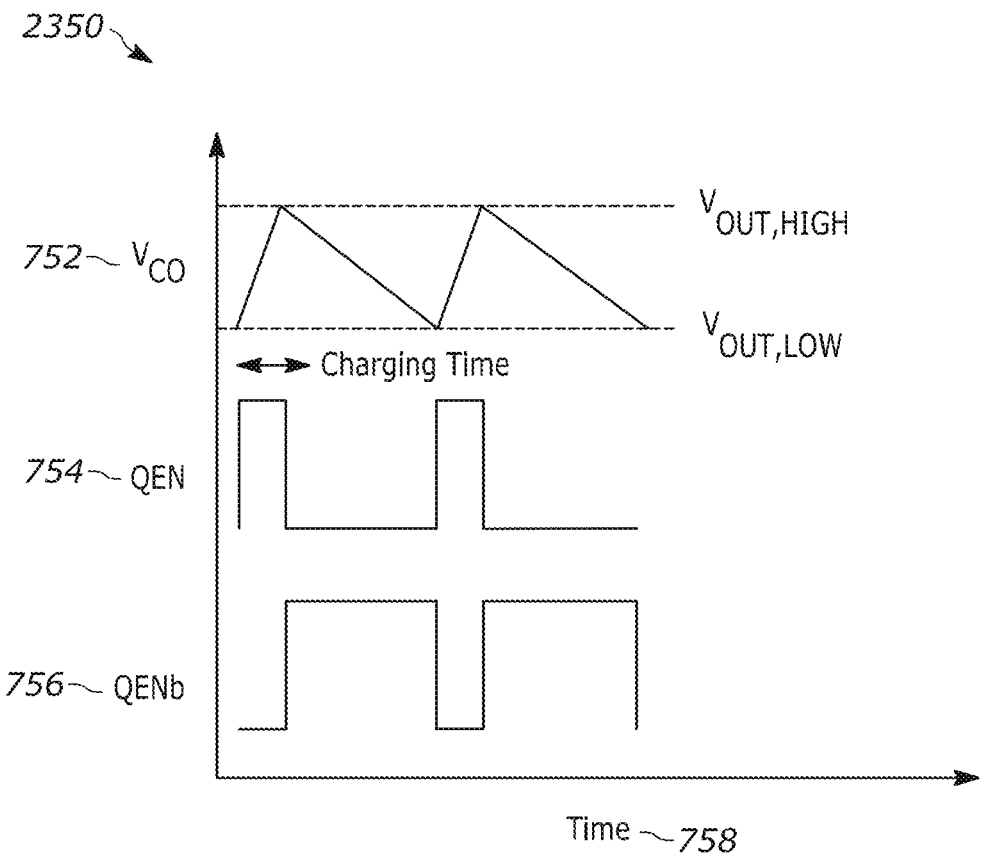
FIG. 23B is a graphical representation of output voltage and control signals with respect to time.

Here, the use of a time to charge an output capacitor in the hysteretic controller is used as an estimate of the output current as illustrated in FIG. 23A. FIG. 23A is a schematic diagram 2300 of a hysteretic controller using a Schmidt trigger 2302. FIG. 23B is a graphical representation 2350 of output voltage 2352 and control signals 2354, 2356 with respect to time 2358. Higher the charging current, lower is the charging time.

The output current from the converter charges the output capacitor $C_O$ when QEN (charge-enable) is high. $C_O$ discharges to deliver power to the load when QEN is low. When delivering power to the load, the energy from the disconnected converter is not utilized leading to inefficient operation.

Figure 24A:
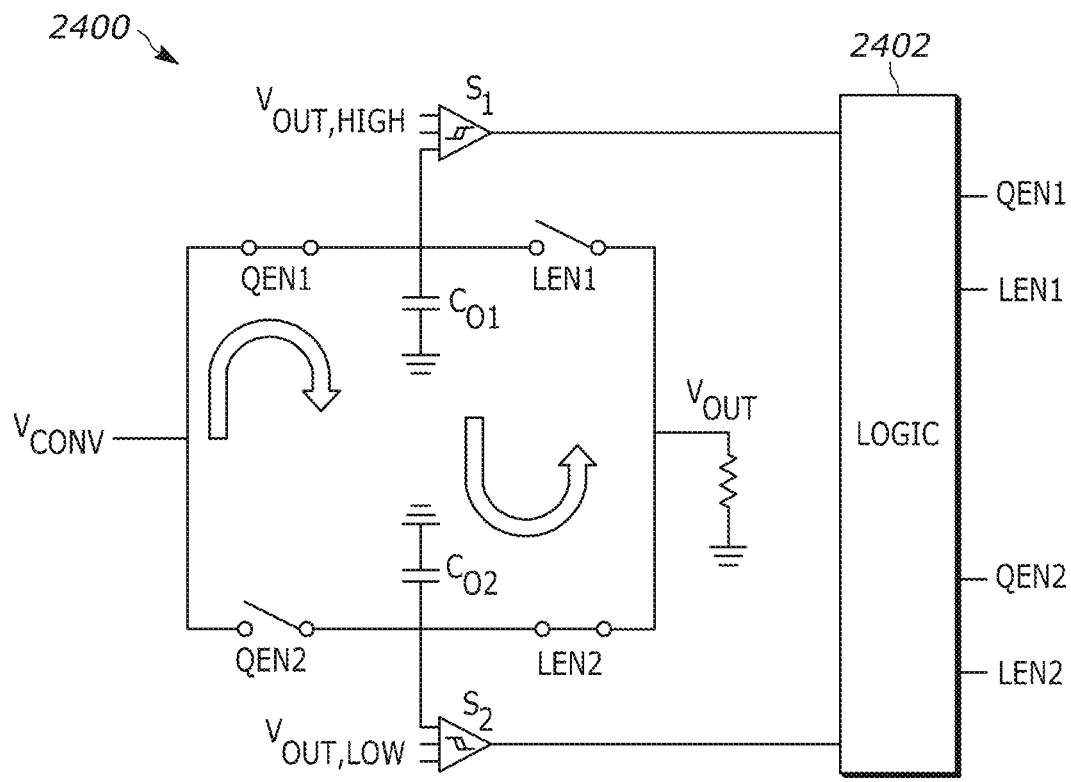
FIG. 24A is a schematic diagram of a ping-pong hysteretic controller.
Figure 24B:
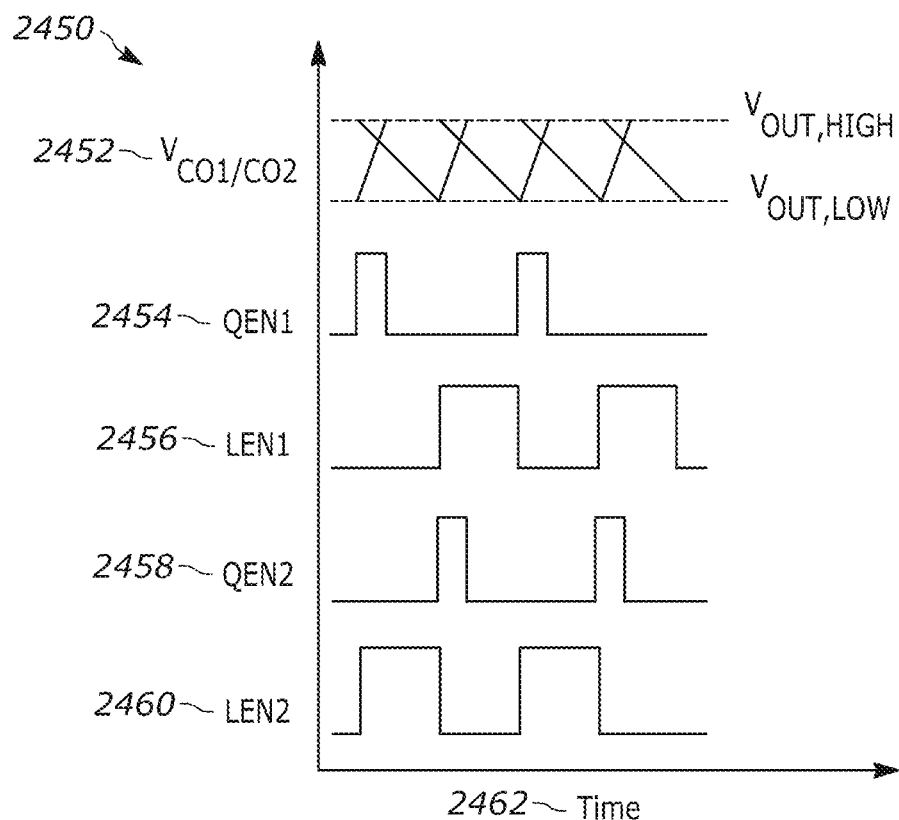
FIG. 24B is a graphical representation of output voltage and control signals with respect to time.

To rectify this issue, a ping-pong hysteretic control technique is disclosed in FIG. 34A. FIG. 24A is a schematic diagram of a ping-pong hysteretic controller 2400 which includes combination logic 2402 to generate control signals. FIG. 24B is a graphical representation 2450 of output voltage 2452 and control signals 2454, 2456, 2458, and 2460 with respect to time 2462. The use of two capacitors stores the output from the converter before it is delivered to the load. As a first capacitor $C_{O1}$ is charging from the converter, the second capacitor $C_{O2}$ discharges to deliver power to the load. Comparing each node to either $V_{OUT,HIGH}$ or $V_{OUT,LOW}$ gives independent control of charging time.

This ping-pong of two capacitors to deliver output power without wasting converter's energy during load delivery makes it more efficient than conventional hysteretic control. In other embodiments, 3 or more capacitors can be used in which the charge is provided to each capacitor in a round robin fashion.

To measure the output current from the converter, the charging time in one or both capacitors can be observed. A hill climbing or perturb and observe algorithm is used to adjust the switching frequency of the clock in such a way that the charging time of the output capacitors is minimized. This algorithm is explained with the flowchart in FIG. 25.

Figure 25:
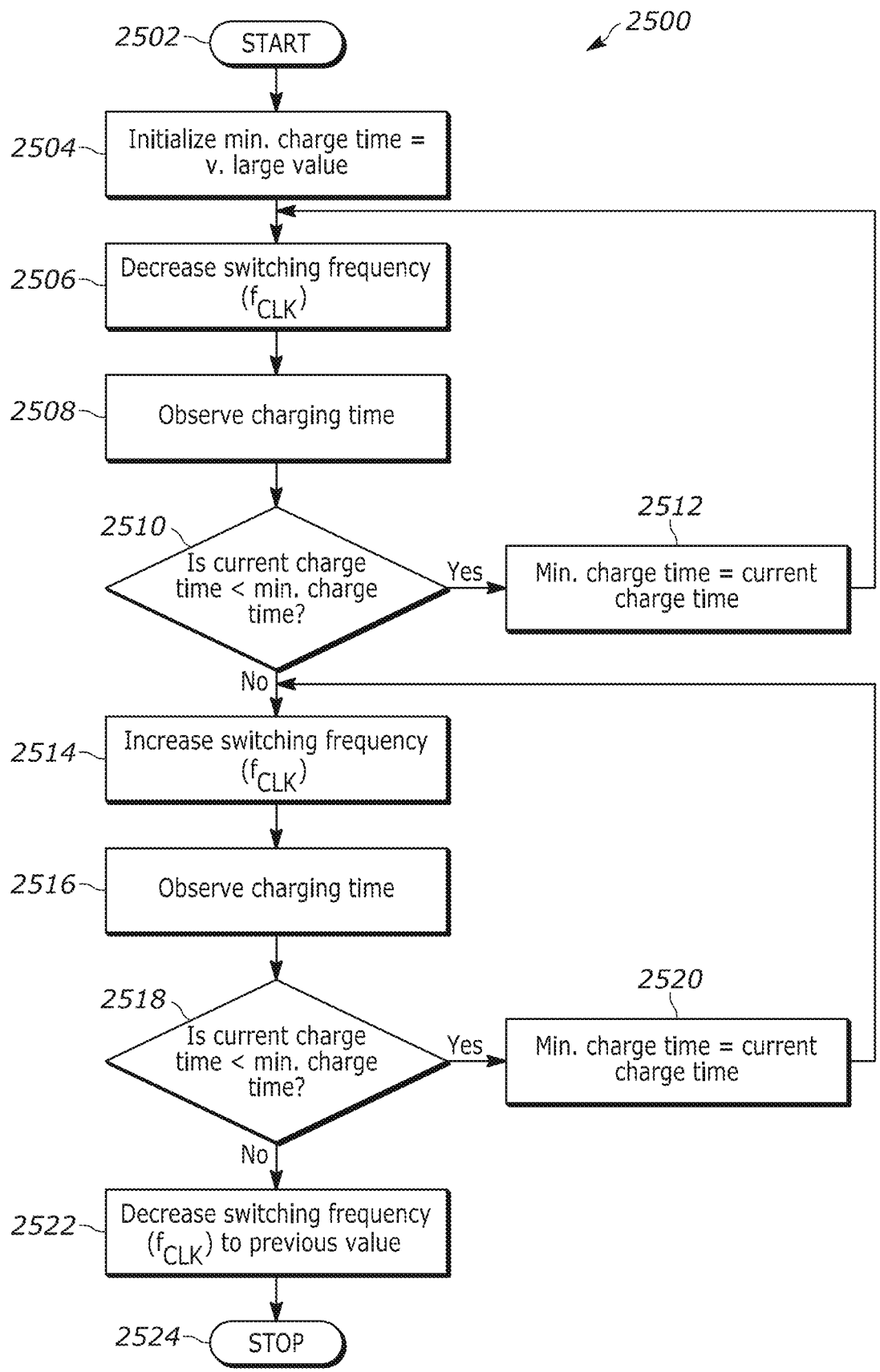
FIG. 25 is flow diagram of a hill-climb algorithm to minimize output capacitor charge time.

FIG. 25 is flow diagram of a hill-climb algorithm 2500 to minimize output capacitor charge time. Here a controller begins operation at step 2502. At step 2504, the controller initializes a minimum charge time to an initial value such as a maximum value based on the capacitors values and output load conditions. At step 2506, the controller decreases the switching frequency ($f_{CLK}$), the decrease amount may be a fixed amount, or a variable amount. At step 2508, the controller monitors the charge time.

At step 2510, the controller compares the charge time with a minimum charge time. If the charge time is less than the minimum charge time the controller sets the minimum charge time to the current charge time in step 2512 and branches back to step 2506. If the charge time is greater than or equal to the minimum charge time the controller branches to step 2514. At step 2514, the controller increases the switching frequency ($f_{CLK}$), and proceeds to step 2516 in which the controller monitors the charging time.

At step 2518, the controller compares the charge time with a minimum charge time. If the charge time is less than the minimum charge time the controller sets the minimum charge time to the current charge time in step 2520 and branches back to step 2514. If the charge time is greater than or equal to the minimum charge time the controller branches to step 2522. At step 2522, the controller decreases the switching frequency ($f_{CLK}$) to the previous value and exits the loop at step 2524.

Figure 26:
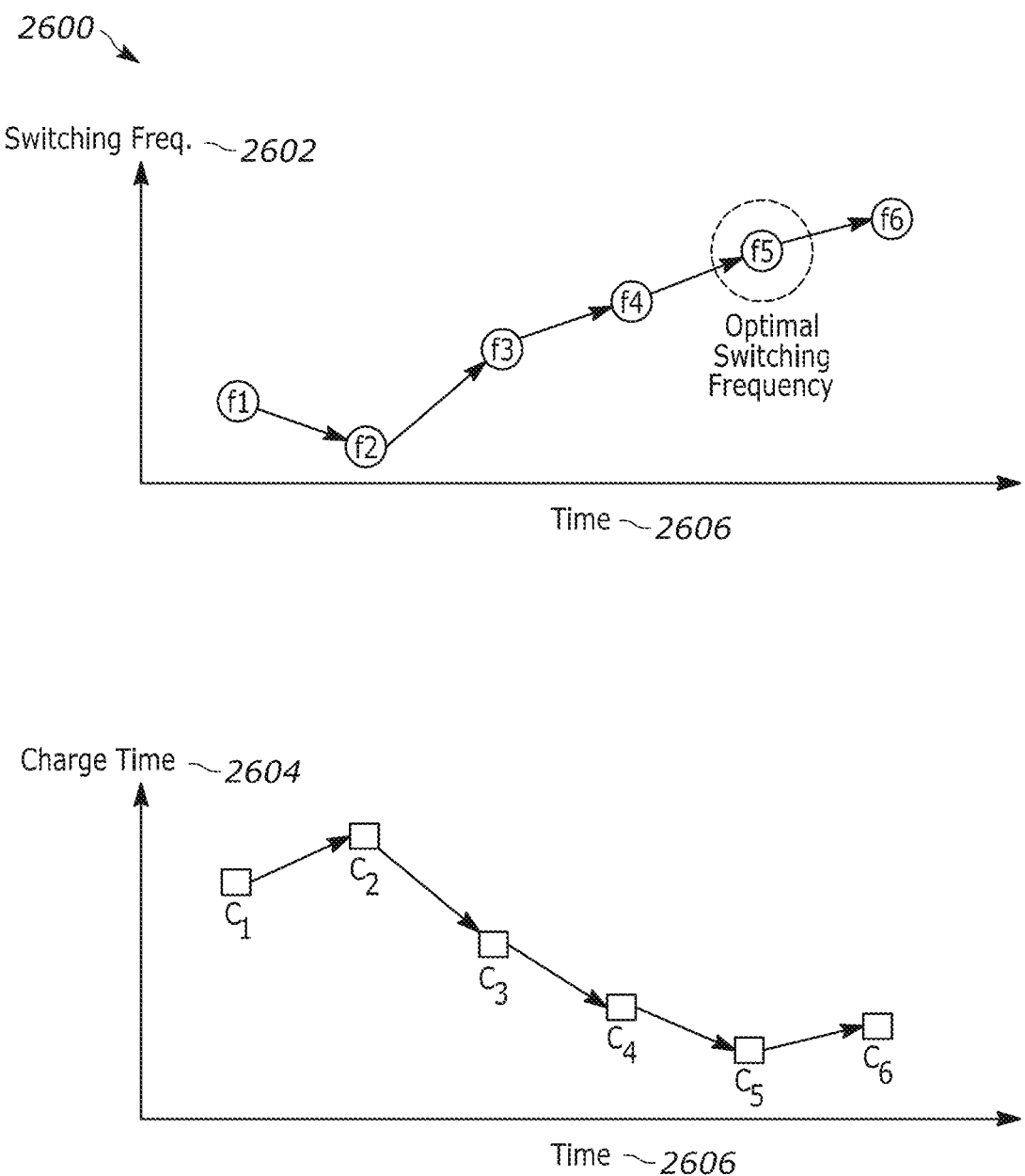
FIG. 26 is a graphical representation of charge time and switching frequency with respect to time.

FIG. 26 is a graphical representation 2600 of charge time 2602 and switching frequency 2604 with respect to time 2606. The variation in switching frequency over a period of time are shown in FIG. 26 for one example case. The algorithm reduces switching frequency from f1 to f2 and the observed charging time increases. Thus, the frequency update direction is reversed and we keep increasing the switching frequency f2 to f5 and observe that charging time keeps reducing. This shows that we are operating our complete system to deliver more output power from the converter. If we increase the switching frequency further to f6, the charging time increase and we stop the hill-climbing algorithm. We select the penultimate value of the switching frequency (f5 in our case) as the most optimal.

The charge time is sensed by converting it to a proportional voltage so that it can be then compared using conventional voltage comparators. A small bias current $I_{BIAS}$ is used to charge capacitors ($C_X$ or $C_Y$) for charge time as shown in FIG. 27.

Figure 27:
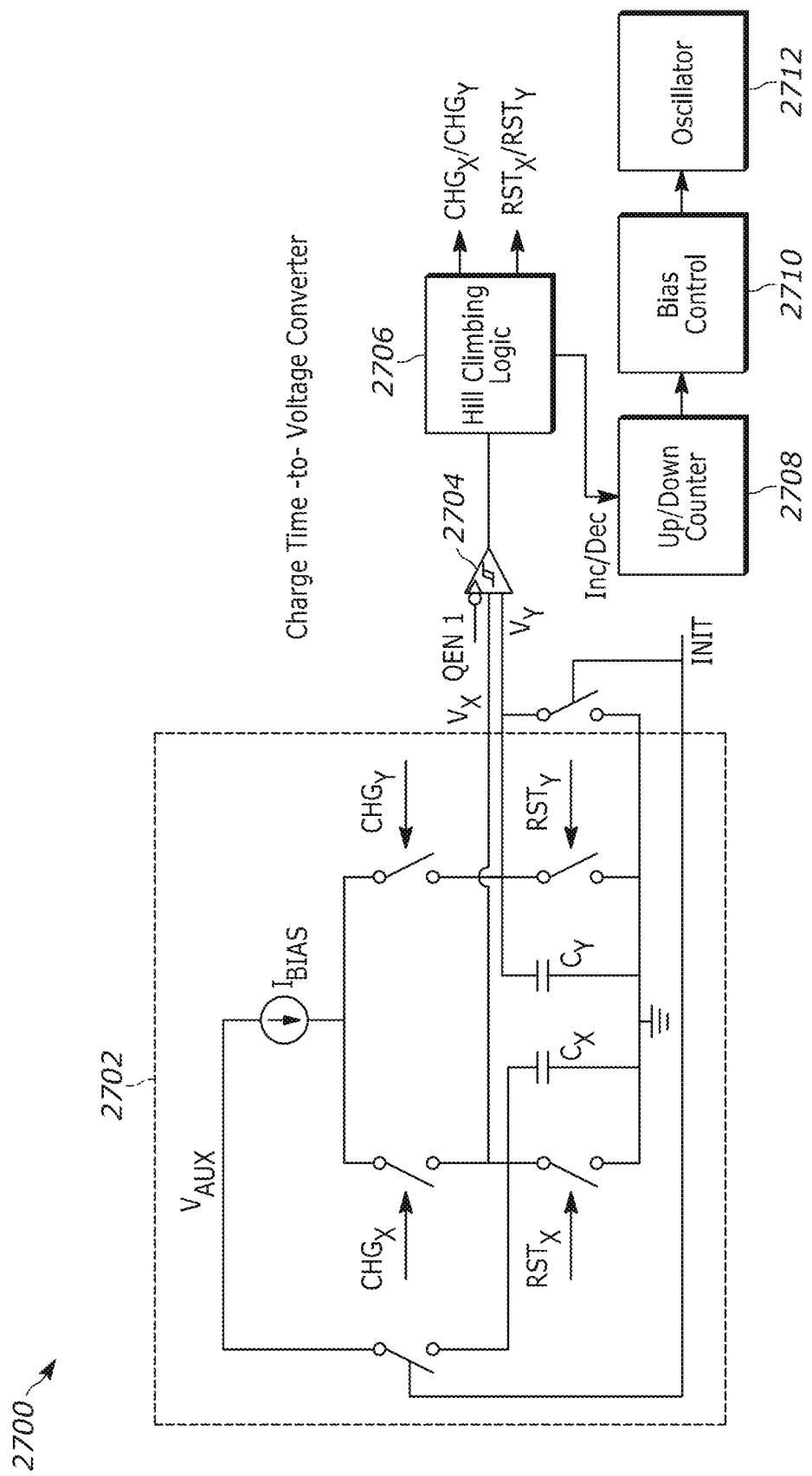
FIG. 27 is a block diagram of an asynchronous maximum output power tracking circuit.

FIG. 27 is a block diagram of an asynchronous maximum output power tracking circuit 2700. The asynchronous maximum output power tracking circuit 2700 includes a capacitor bank 2702 a Schmidt trigger comparator 2704, hill climb logic 2706 that may be used to control the charging and resetting of capacitors in the capacitor bank 2702. The hill climb logic 2706 feeds an up/down counter 2708 that then has a bias control 2710, to set a frequency of an at least one oscillator 2712.

Initially $C_X$ is charged to supply $V_{AUX}$ while $C_Y$ stores the charge time corresponding to current frequency f1. The frequency is reduced from f1 to f2 and the $I_{BIAS}$ charges $C_X$ for the increased charge time. Thus, the voltage comparator decides $V_X$ to be greater than $V_Y$. We keep the minimum value in $C_Y$ and reset $C_X$. The hill-climbing logic asserts to increment the frequency and an up/down counter sets the bias control for new switching frequency f3. $I_{BIAS}$ recharges $C_X$ for reduced charging time, in our example case, and the voltage comparator decides that $V_X$ is less than $V_Y$. $C_Y$ is now reset and frequency update continues until charging time starts increasing again.

The circuits proposed here can be designed to be asynchronous circuits that switch only when one charge period ends. This prevents power dissipation at each clock.

Maximum Power Point Tracking (MPPT) control regulates the boost converter clock frequency generated by the IRO. The boost converter's switching frequency modulates the input and output impedances of the converter. Interfacing with finite source and load impedances, the MPPT control maximizes load current delivery at the regulated output voltages. Minimizing the QEN1/QEN2 pulse width maximizes load current and hence the output power delivered to the load.

In the circuit of FIG. 27, a small bias current ($I_{BIAS}$) charges a capacitor ($C_A$ or $C_B$) and converts QEN1's charging time to voltage. Comparing $V_A$ and $V_B$ helps compare the charging times at different frequencies. $V_A$ is initialized to $V_{AUX}$ and $V_B$ is initialized to GND during power up. The hill climbing logic block selects $C_A$ or $C_B$ to retain the smaller voltage and overwrite the larger voltage after resetting it. Thus, the switching frequency progressively decreases or increases until QEN1 pulse width starts increasing. This is established using an increment or decrement signal to an up/down counter that controls the biasing of the HF oscillator again referring to FIG. 27.

The hill climbing logic is implemented as a custom event-triggered logic that evaluates the new states only on QEN1's falling edge. This slow evaluation enables ultra-low power operation and gives sufficient time for updating the HF oscillator frequency. Thus, each QEN1 pulse width corresponds to a different switching frequency.

Figure 28:
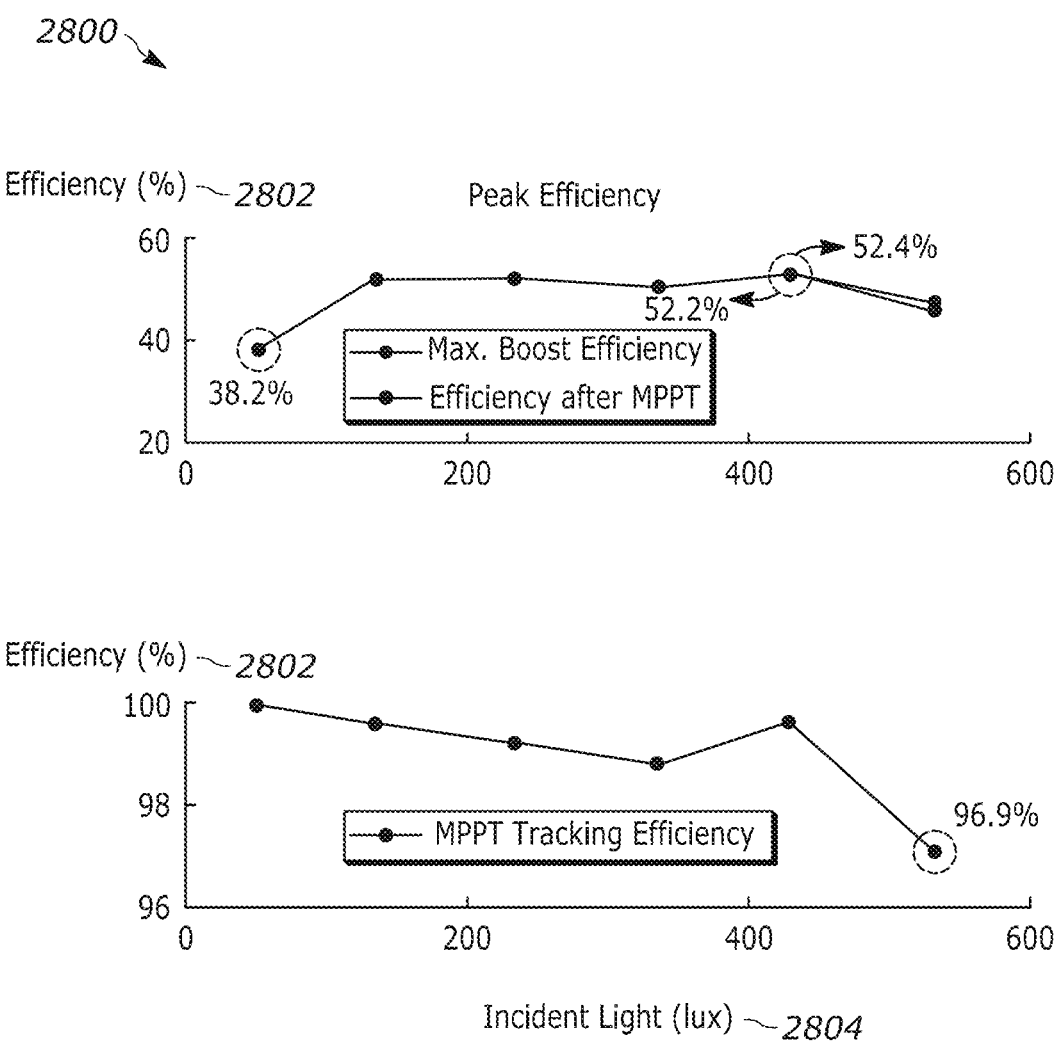
FIG. 28 is a graphical representation of measured peak efficiency and tracking efficiency of a system using maximum power point tracking with respect to time.

FIG. 28 is a graphical representation 2800 of measured peak efficiency 2802 and tracking efficiency of a system using maximum power point 2804 with respect to time 2806.

FIG. 28 shows the maximum boost converter efficiency and the tracking efficiency under various light intensities. The measurements were taken with a 2-12 MΩ load on $D_{VDD}$ and a 27-530 MΩ load on $AV_{DD}$ (lower load resistance at brighter illumination). The maximum boost converter efficiency is found by sweeping the switching frequency around the MPPT-predicted value. The MPPT tracking efficiency is the ratio of the efficiency predicted by the MPPT loop and the maximum efficiency found by sweeping. Our boost converter works at a maximum efficiency of 52.4% in indoor lighting condition of 430 lux. At a low light of 52 lux, the boost converter efficiency is 38.2% at a minimum input power of 79.1 nW. The MPPT output power tracking efficiency exceeds 96%.

For a self-powered transducer such as an image sensor, the power supply rails must be charged up to the required voltage before the image sensor can start capturing images. This is accomplished using a DC-DC converter to generate these supply rails from incident light. However, operating this DC-DC converter also requires stable supply rails.

This disclosure addresses the cold-start of a DC-DC converter using fringe incident light proximate to the image sensor. The disclosure illustrates how to convert very low levels of light to higher voltages and establishing stable power supply rails after which a conventional DC-DC converter can maintain the power supply rails and sensor can then be used to capture an image.

Light from the object passes through a lens or system of lenses and falls on the image sensor. Some fraction of the light passing through the lens or system of lenses also falls on the peripheral area around the image sensor. This fringe light energy is used to cold-start the DC-DC converter to generate the imager's power supply rails.

In this disclosure, the peripheral area is populated with photodiodes arranged in series, parallel, and a combination thereof configured to harvest an unregulated voltage, Vaux, which is high enough to allow operation of circuitry but it has very limited current drive capacity. The auxiliary voltage (Vaux) enables/powers the operation of a low frequency (LF) oscillator which drives a DC-DC converter used to generate the main supply voltage.

Figure 29:
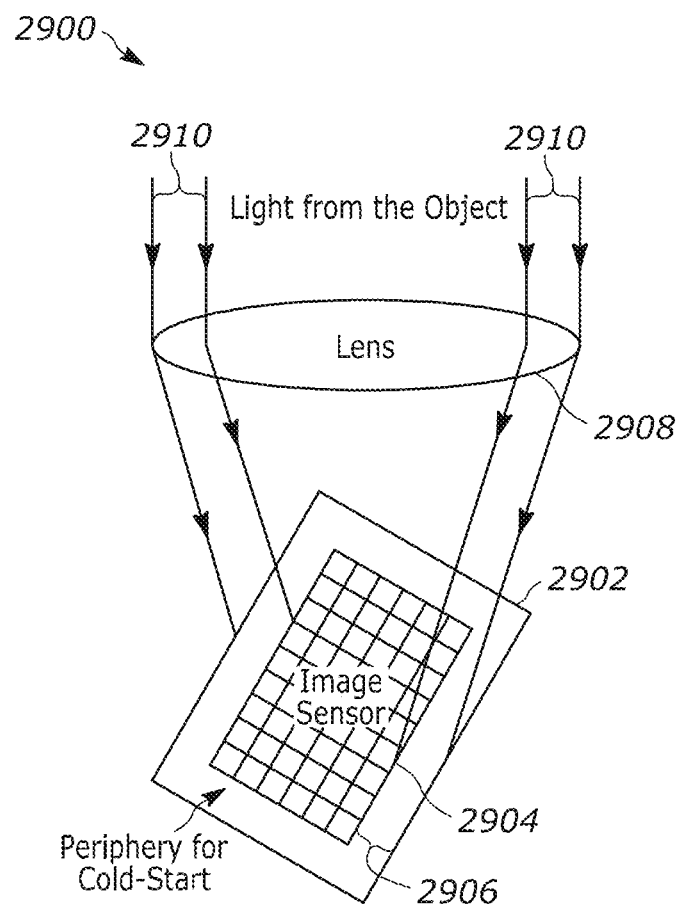
FIG. 29 is a perspective view of an image sensor with peripheral diodes configured to capture light adjacent to an image field of view.

FIG. 29 is a perspective view of an integrated circuit (IC) 2902 including an image sensor 2904 and a peripheral area 2906 having diodes. The image sensor is configured to capture light from an object gathered via a lens 2908 or lens system. The peripheral area 2906 is configured to capture peripheral light 2910 passing through the lens 2908 incident to the IC 2902 and adjacent to an area of the image sensor 2904.

Figure 30:
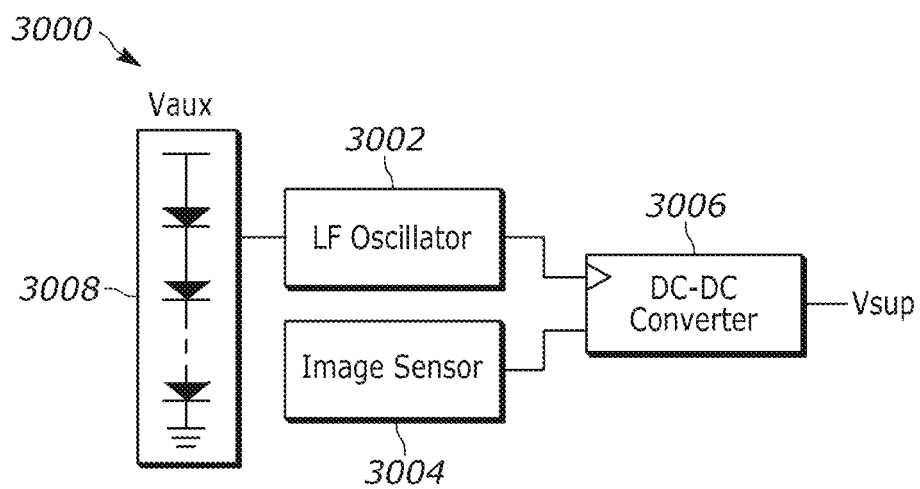
FIG. 30 is block diagram of auxiliary energy harvesting diodes configured to power up a system via a DC-DC converter with a low frequency (LF) oscillator.

FIG. 30 is block diagram of an auxiliary energy harvesting system 3000 having auxiliary diodes 3008 proximate to an image sensor 3004 and configured to provide power via a DC-DC converter 3006 with a LF oscillator 3002.

Figure 31:
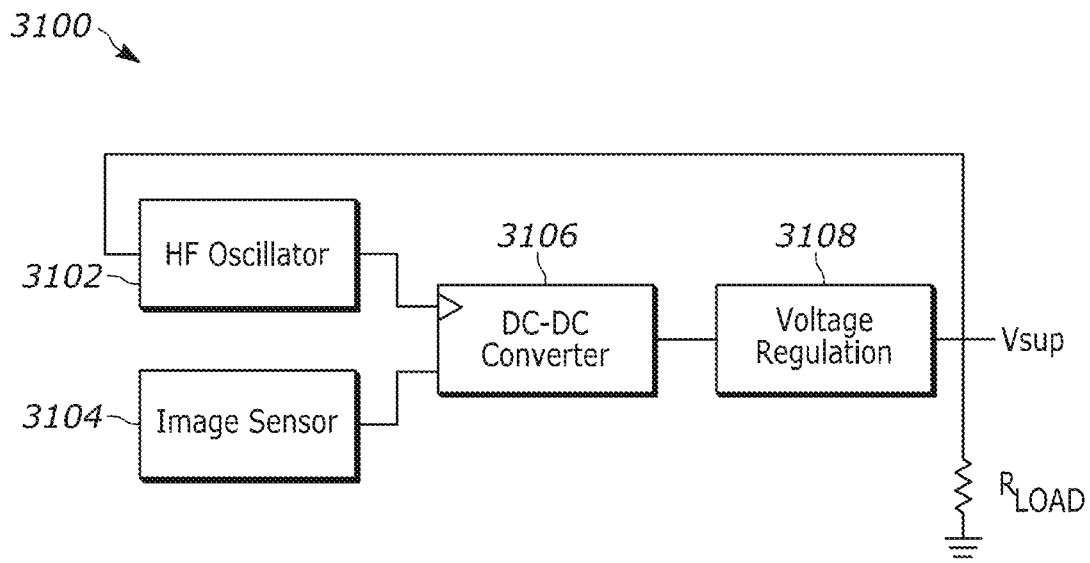
FIG. 31 is a block diagram of an image sensor in an energy harvesting mode using a DC-DC converter with a high frequency (HF) oscillator.

FIG. 31 is a block diagram of an auxiliary energy harvesting system 3100 having an image sensor 3104 in an energy harvesting mode using a DC-DC converter 3106 clocked by a HF oscillator 3102 to feed a voltage regulator 3108 to generate a supply voltage $V_{sup}$.

The primary input voltage (energy) to the DC-DC converter 3006 is generated by the image sensor 3004 configured as energy harvester. Using the LF oscillator 3002 the energy from Vaux is used to boost the voltage on $V_{sup}$ to a sufficient level to allow a secondary high frequency (HF) oscillator 3102 to take over. Once in this regular operation configuration the cold-start has completed and the energy can be stored or used to drive a load ($R_{load}$) as shown in FIG. 31. Regular operation can generate much more energy from the imager sensor 3004, 3104 because it used a high frequency oscillator 3102 to drive the DC-DC converter 3006, 3106.

During start up from complete power off, light first falls on the image sensor, while all the power supply voltage rails are substantially at a ground potential. Once these rails reach a threshold voltage level, regular conversion using a HF oscillator may begin as shown in FIG. 31.

Figure 32:
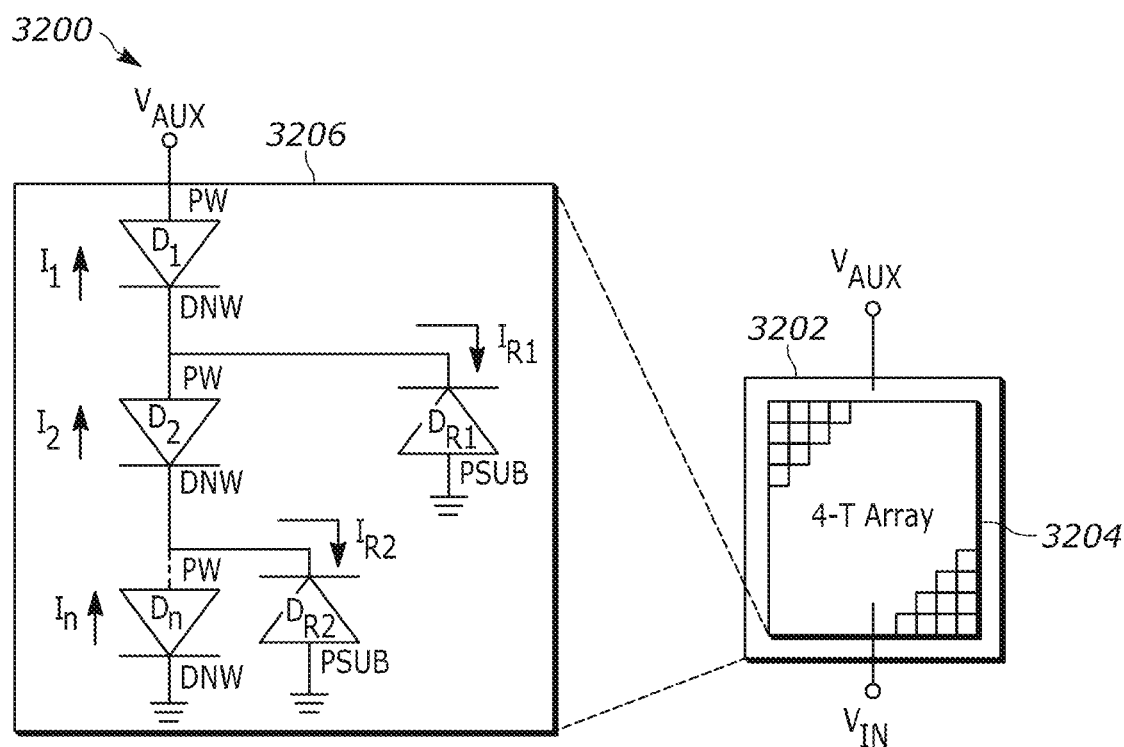
FIG. 32 is a diagram of a diode stack arranged adjacent to an image sensor.

FIG. 32 is a diagram of an imaging system 3200 including an integrated circuit 3200 with a pixel array 3204 and a diode stack 3206 arranged adjacent to the pixel array 3204. The diode stack has a first diode $D_1$ in which the anode is a P-well (PW) and the cathode is a deep N-well (DNW), a second diode $D_2$ in which the anode is a P-well (PW) and the cathode is a deep N-well (DNW) and in series with the $D_1$, and forming a string of series diodes up to an $N^{th}$ diode $D_n$ in which the anode is a P-well (PW) and the cathode is a deep N-well (DNW). The current through $D_1$ is $I_1$ and the current through $D_2$ is $I_2$ which equals the current through $I_1$ and a leakage current $I_{R1}$ through the substrate diode $D_{R1}$. Also, the current through $D_n$ is $I_n$ which equals the current through $I_2$ ($I_1+I_{R1}$) and a leakage current $I_{R2}$ through the substrate diode $D_{R2}$ One embodiment of an arrangement of auxiliary photodiode stack around the energy harvesting (EH) image sensor is shown in FIG. 32 that is based on a test IC. The test IC was configured with nine photodiodes stacked to form a series connection. In other embodiments, the auxiliary diode arrangement may not be around the complete circumference of the pixel array, but may be on a side of the pixel array, or multiple sides of the pixel array. Also, the test chip combined both the pixel array and auxiliary diodes monolithically, however in other embodiments, the auxiliary diodes may be on a separate chip such that the two chips are combined in a multi-chip module (MCM).

FIG. 33 is cross-sectional diagram 3300 of an embodiment of two monolithic semiconductor structures, $S_0$ and $S_1$ configured to capture light. A first structure $S_0$ has three junctions, $J1_1$ between an N-region and a P-well (PW), $J2_1$ between the PW and deep N-well (DNW), and $J3_1$ between a P substrate (PSUB) and the DNW. The three junction form three diode $D_{O1}$, $D_{O2}$, $D_{O3}$. This structure includes interconnects such that $D_{O3}$ and $D_{O2}$ are in parallel and $D_{O1}$ is reverse biased.

FIG. 34 is cross-sectional diagram 3400 of an alternative embodiment of two semiconductor structures, $S_0$ and $S_1$ configured to capture light. Similar to FIG. 33, this structure has a first structure $S_0$ has three junctions, $J1_1$ between an N-region and a P-well (PW), $J2_1$ between the PW and deep N-well (DNW), and $J3_1$ between a P substrate (PSUB) and the DNW. The three junction form three diode $D_{O1}$, $D_{O2}$, $D_{O3}$. This structure includes interconnects such that $D_{O1}$ is forward biased and $D_{O2}$ and $D_{O1}$ are reverse biased.

In the test chip, each photodiode in the stack was in a dedicated separate deep Nwell as shown in the cross-section of the structure in FIGS. 33 and 34. To account for the reverse saturation current leakage at each deep Nwell-Psubstrate junction (I2, I3), the photodiodes lower in the stack are made larger. The size of the photodiodes decrease progressively as we go higher in the stack as shown in the schematic of FIG. 32. The lowest photodiode is larger as it has to carry larger (I1+I2+I3) current than the one on the above it which carries (I1+I2) current. This pyramid structure of entire stack of nine photodiodes is shown in the schematic of FIG. 32 and greatly improves the current drive capability of generated Vaux supply range.

The sizing of the diodes is approximately in geometric progression rounded to nearest integer. Each photodiode in the stack is made of group of unit cells. This makes the layout of the stack in the peripheral area highly flexible while maintaining the geometric progression ratio.

Figure 35:
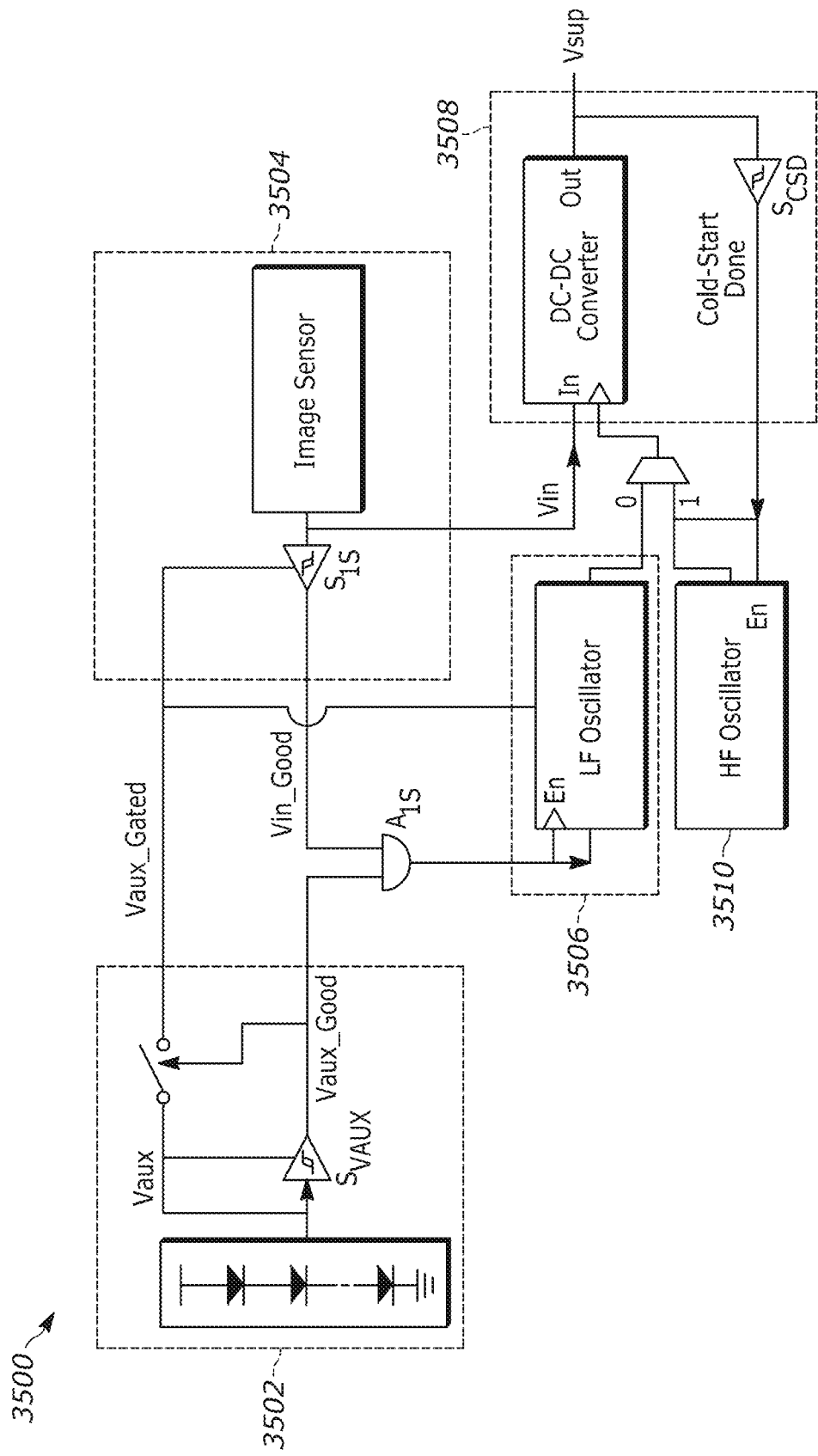
FIG. 35 is a schematic diagram of image sensor node having peripheral diodes to capture adjacent light used for cold start sequence of self-powered energy harvester.

FIG. 35 is a schematic diagram of image sensor node 3500 having peripheral diodes 3502 and an image sensor 3504. The peripheral diodes 3502 are configured to harvest energy from light at the periphery to the image sensor 3504. The image sensor 3504 is configured to harvest energy and to capture images. The system 3500 uses a low frequency (LF) oscillator 3506 to a DC-DC converter 3508 during cold start and then switches to a high frequency (HF) oscillator during normal operation once sufficient power is achieved.

However, power sequencing must follow a well-defined order to prevent any unwanted leakage through the chip and ensure proper functionality. This is sequence of steps for cold start are shown in FIG. 35.

For energy-autonomous operation, an IC was built such that the system 3500 starts using the $V_{AUX}$ supply rail when light first shines on the chip. The test device delivered approximately 25 nW at 1.8 V under dim indoor lighting condition (25 lux). The four-phase cold start sequence shown in FIG. 35 is described as follows:

First the entire chip 3500 is power gated until the Vaux ramp crosses a certain threshold and asserts the $V_{AUXGD}$ ($V_{AUX\_GOOD}$) signal.

Second, a comparator powered by $V_{AUX}$ asserts $V_{INGD}$ ($V_{IN\_GOOD}$) when $V_{IN}$ exceeds a fraction of the open-circuit voltage ($V_{OC}$) of an isolated pixel. In other words, when $V_{IN}$ exceeds a threshold level.

Third, an ultra-low power, low-frequency (LF) oscillator 3506, working from the $V_{AUX}$ rail, generates non-overlapping clocks for the SC boost converter.

Fourth, the SC boost converter steps up $V_{IN}$ to the $A_{VDD}$ and $D_{VDD}$ rails without delivering power to the load. Once the output rails are within a regulation range (e.g., 1%, 2%, 3%, 4%, 5%, of a desired output voltage) the COLDST (cold start done) signal is asserted to begin normal operation with the HF oscillator and the same boost converters. The always-on wake-up comparator $A_{IS}$ in FIG. 35 may have a built in weight or offset to realize a built-in reference. When $V_{AUX}$ exceeds the threshold (~1.8 V) generated by the offset, $V_{AUXD}$ is asserted. The $V_{AUXD}$ dependent PMOS load device introduces hysteresis.

A more detailed flow follow the below four steps:

Step 1: With incident light, Vaux from photodiode stack ramps to a higher voltage. When it crosses a certain minimum threshold, Vaux_Good signal is asserted. This turns on the power gating switch and power from Vaux_Gated reaches all other parts of the chip. Until Vaux_Good is asserted, the rest of the chip does not get any power and hence, the only power consuming block in the entire chip is ultra low-power Vaux comparator.

Step 2: After Vaux_Good is asserted, input voltage from Vin from the imager pixels is compared to a certain reference. Once Vin reaches a stable voltage above a certain minimum value, Vin_Good is asserted.

Step 3: Assertion of both Vaux_Good and Vin_Good implies that we can start running the bias currents and LF oscillator from Vaux_Gated supply at a very small current and very low frequencies.

Step 4: These low frequency clocks then drive the DC-DC converter to generate the output Vsup voltage. Vsup reaching a minimum defined value asserts Cold-Start Done signal. This assertion then enables regular high efficiency mode of conversion using HF oscillator.

Vin keeps getting converted to Vsup at a much higher efficiency and output load delivery is enabled. Output Vsup is regulated to be within a certain voltage band An advantage of or this system and method is that it enables cold-start of a self-powered image sensor. This is achieved this without using any extra battery, super capacitor, inductor, or charge pump in the circuit and therefore offers a cost and size advantage.

Each photodiodes have two vertically stacked light harvesting PN junction: NDiff-Pwell and Pwell-deep Nwell. Each photodiode sits in its own deep Nwell.

There is reverse photocurrent loss at each deep Nwell-Psubstrate junction shown in FIGS. 32, 33, and 34. In another embodiment, the photodiodes in the stack are sized approximately in geometric progression to account for the reverse current junction leakage between two consecutive photodiodes. This enables higher current delivery from Vaux supply.

The ratio of the sizes of photodiodes is selected to be <2 to supply the deep Nwell-Psub photocurrent loss while still keeping area of the auxiliary photodiode stack small enough to fit in the periphery of the pixel array.

Several small unit photodiodes are arranged in parallel to generate a larger photodiode. The smaller photodiodes can be arranged in the peripheral ring outside the pixel array shown in FIG. 32.

This cold-start scheme ensures each supply rail reaches its defined voltage level without any leakage current or loss of functionality under all lighting conditions.

Figure 36:
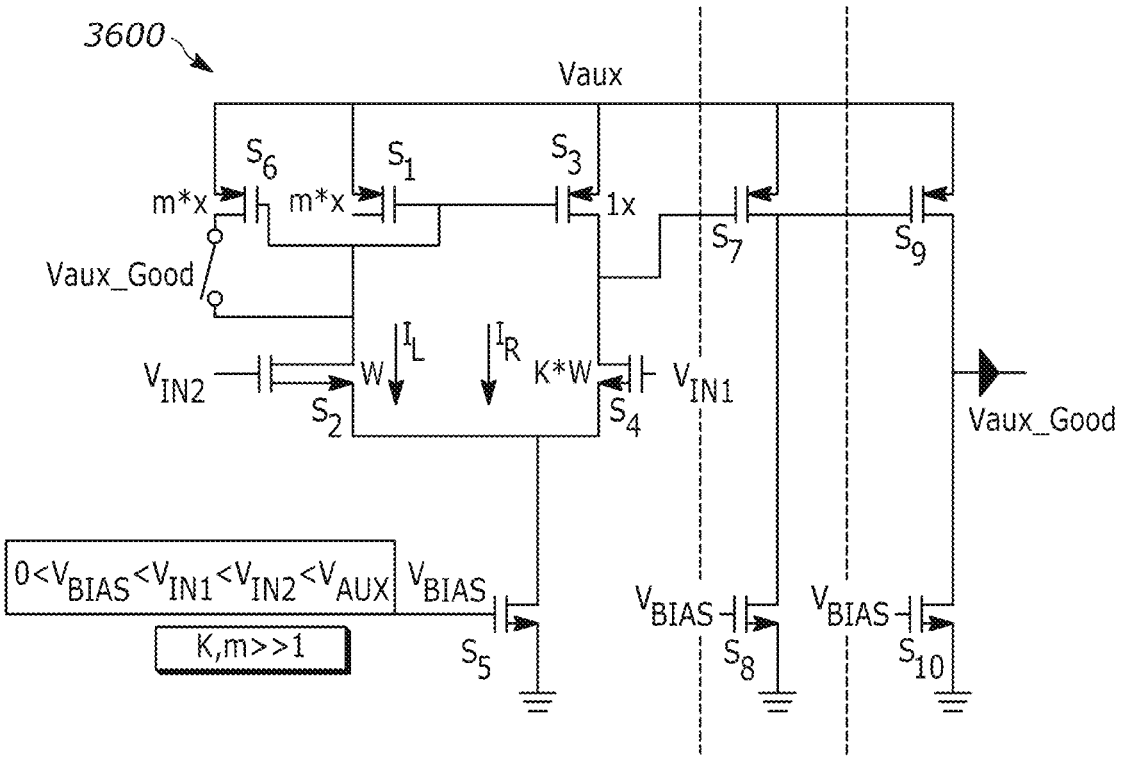
FIG. 36 is a schematic diagram of a comparator with a in-built reference threshold for power-on-reset (POR).

When the light is first incident on the chip, there is no reference voltage to compare to Vaux, so a new skewed comparator with offset that can act as a reference is disclosed in FIG. 36.

Figure 37:
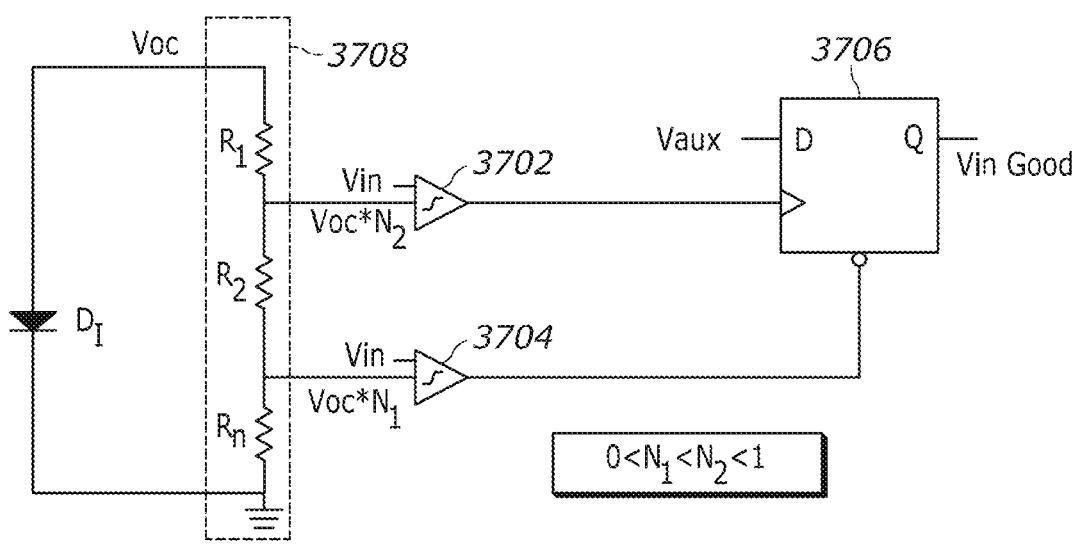
FIG. 37 is a schematic diagram of a hysteretic comparator with a reference voltage generated by an isolated photo diode.

And, a fraction of open circuit voltage ($V_{OC}$) of an isolated photodiode is used as a reference to compare Vin with is disclosed in FIG. 37.

The cold-start sequence shown in FIG. 35 begins with Vaux generation having the following four steps.

Step 1: Vaux is the supply and the input of a skewed comparator as shown in FIG. 36. FIG. 36 is a schematic diagram of comparator 3600 with in-built reference threshold for power-on-reset (POR). When light first falls on photodiodes, Vaux is close to ground and $I_L \sim I_R \sim 0$. Initially with small Vaux, $I_R > I_L$ due to the skewed sizing. However, as Vaux ramps up beyond a certain voltage level, $I_L > I_R$ due to the exponential dependence of drain current of transistor on gate voltage when operating in subthreshold region. In this way, reference voltage is inbuilt into the comparator.

Ultra-low power operation is achieved with tail current source biased in deep subthreshold. Hysteresis in the threshold is introduced by skewing the load of the comparator depending on current Vaux_Good value. In the test chip to provide an offset in the comparator for the steps, the $V_{IN1}$ was set to be $3/V_{AUX}$, $V_{IN2}$ was set to be $5*V_{AUX}/8$, and $V_{BIAS}$ was set to be $V_{AUX}/8$ such that $0 < V_{BIAS} < V_{IN1} < V_{IN2} < V_{AUX}$.

Step 2: When Vaux_Good is asserted, the power-gated Vaux_Gated supply enables the comparators to check if the $V_{IN}$ rail from the imager pixels is high enough to be loaded. The reference for the Vin_Good generation is implemented using a fraction of open circuit voltage ($V_{OC}$) of an isolated photodiode as illustrated in FIG. 37. $V_{OC}$ is the maximum voltage attained by unloaded Vin.

FIG. 37 is a schematic diagram 3700 of hysteretic comparator with reference voltage generated by an isolated photo diode $D_1$. A first comparator 3702 and second comparator 3704 have a reference voltage input from a voltage divider 3708 that is used to create reference voltages from the diode $D_1$ voltage. The output of the first comparator 3702 is used to enable the Flip-Flop, while the output from the second comparator 3704 is used to drive the active low RESET of the Flip-Flop.

Step 3: After Vaux_Good and Vin_Good assertion, low power current bias generation followed by non-overlapping clock generation using LF oscillator is implemented.

Step 4: These non-overlapping clocks drive the DC-DC converter to generate stable Vsup power rail. Once this rail is established, regular operation using HF oscillator delivers power to the load at regulated voltage level.

Figure 38:
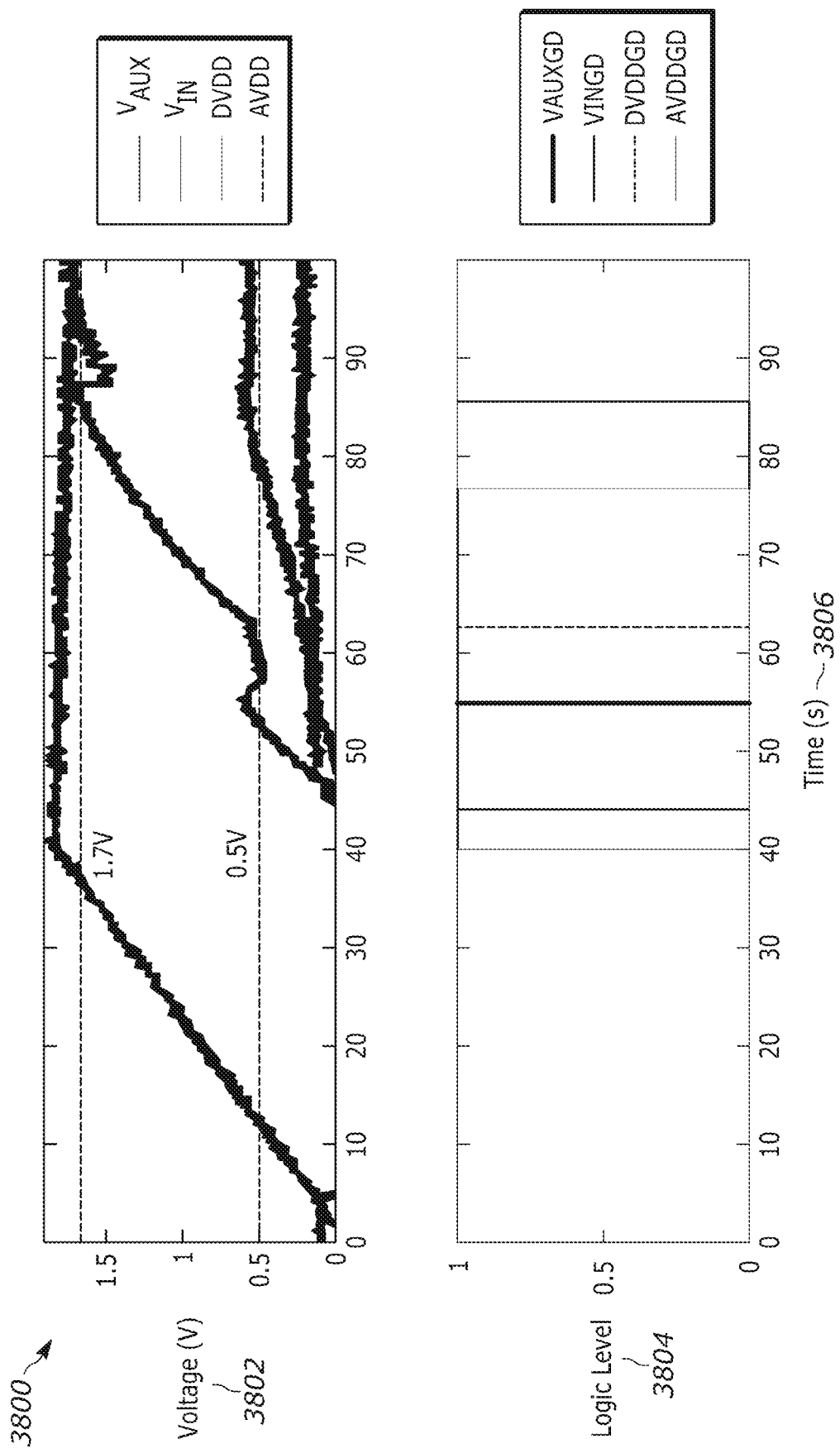
FIG. 38 is a graphical representation of measured voltage and logic levels of a cold start image sensor using peripheral diodes with respect to time.
Figure 39:
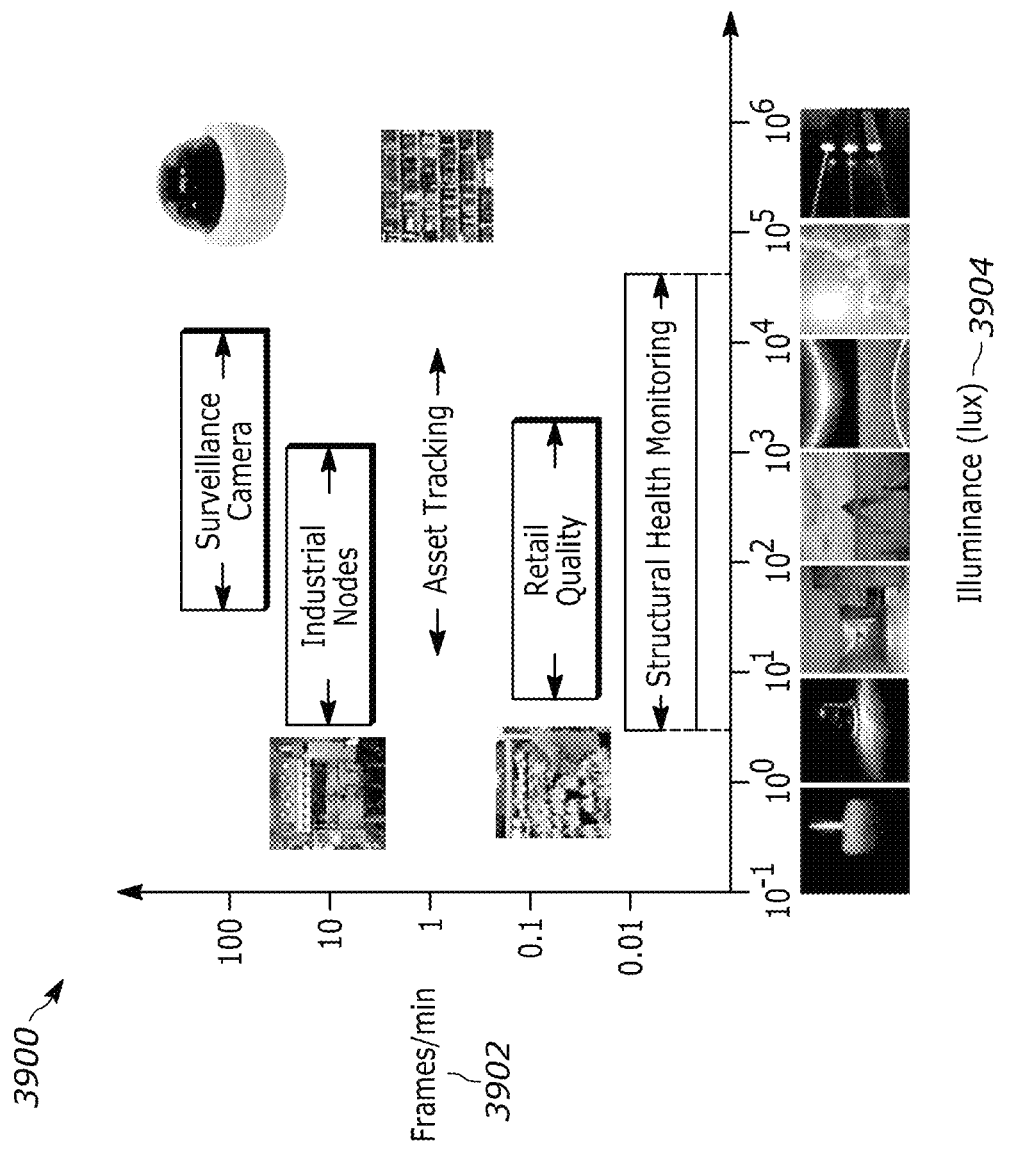
FIG. 39 is a graphical representation of typical image sensor applications based on an image capture rate with respect to time.

FIG. 38 is a graphical representation 3800 of measured voltage 3802 and logic levels 3804 of a cold start image sensor using peripheral diodes with respect to time.

FIG. 38 illustrates the measured cold start sequence waveforms. $V_{AUXGD}$ is asserted once $V_{AUX}$ ramps above 1.8 V and $V_{INGD}$ is asserted when $V_{IN}$ exceeds 0.7 $V_{OC}$. Once $DV_{DDGD}$ and $AV_{DDGD}$ are asserted, the chip begins normal operation and provides regulated output voltages.

The program code embodying the algorithms and/or methodologies described herein is capable of being individually or collectively distributed as a program product in a variety of different forms. The program code may be distributed using a computer readable storage medium having computer readable program instructions thereon for causing a processor to carry out aspects of one or more embodiments. Computer readable storage media, which is inherently non-transitory, may include volatile and non-volatile, and removable and non-removable tangible media implemented in any method or technology for storage of information, such as computer-readable instructions, data structures, program modules, or other data. Computer readable storage media may further include RAM, ROM, erasable programmable read-only memory (EPROM), electrically erasable programmable read-only memory (EEPROM), flash memory or other solid state memory technology, portable compact disc read-only memory (CD-ROM), or other optical storage, magnetic cassettes, magnetic tape, magnetic disk storage or other magnetic storage devices, or any other medium that can be used to store the desired information and which can be read by a computer. Computer readable program instructions may be downloaded to a computer, another type of programmable data processing apparatus, or another device from a computer readable storage medium or to an external computer or external storage device via a network.

Computer readable program instructions stored in a computer readable medium may be used to direct a computer, other types of programmable data processing apparatus, or other devices to function in a particular manner, such that the instructions stored in the computer readable medium produce an article of manufacture including instructions that implement the functions, acts, and/or operations specified in the flowcharts or diagrams. In certain alternative embodiments, the functions, acts, and/or operations specified in the flowcharts and diagrams may be re-ordered, processed serially, and/or processed concurrently consistent with one or more embodiments. Moreover, any of the flowcharts and/or diagrams may include more or fewer nodes or blocks than those illustrated consistent with one or more embodiments.

While all of the invention has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of the general inventive concept.

What is claimed is:

1. A interleaved ring oscillator comprising:
a first ring oscillator having a plurality of NOT gates, in a first stage, a first inverter that is gated by a first high-side switch and a first low-side switch;
a second ring oscillator having, in the first stage, a second inverter that is gated by a second high-side switch and a second low-side switch; and
wherein the first ring oscillator generates a first phase clock signal, and the second ring oscillator generates a second phase clock signal that is out of phase with the first phase clock signal, wherein a first output of the first inverter enables the second high-side switch and the second low-side switch, and a second output of the second inverter enables the first high-side switch and the first low-side switch.

2. The oscillator of claim 1, further comprising a first, second, and third multiplexer having the first phase clock signal and second phase clock signal as inputs and a controller configured to operate the first, second, and third multiplexer to generate a 3-phase clock.

3. The oscillator of claim 2, wherein the first phase clock signal is out of phase with the second phase clock signal by 160 degrees.

4. The oscillator of claim 1 further comprising:
in a second stage of the first ring oscillator, a third inverter that is gated by a third high-side switch and a third low-side switch;
in the second stage of the second ring oscillator, a fourth inverter that is gated by a fourth high-side switch and a fourth low-side switch;
in a third stage of the first ring oscillator, a fifth inverter that outputs a first ring oscillator output and is gated by a fifth high-side switch and a fifth low-side switch; and
in the third stage of the second ring oscillator, a sixth inverter that outputs a second ring oscillator output and is gated by a sixth high-side switch and a sixth low-side switch, wherein the first ring oscillator output of the first ring oscillator is input to the second inverter and the second ring oscillator output of the second ring oscillator is input to the first inverter.

5. The oscillator of claim 4 further comprising a first power gated buffer coupled with the first ring oscillator output, a second power gated buffer coupled with the second ring oscillator output, wherein the first power gated buffer is enabled by with the second ring oscillator output and the second power gated buffer is enabled by with the first ring oscillator output.

6. The oscillator of claim 5, wherein a third output of the third inverter enables the fourth high-side switch and the fourth low-side switch, and a fourth output of the fourth inverter enables the third high-side switch and the third low-side switch.

7. The oscillator of claim 6, wherein the first and second ring oscillators are current starved ring oscillators.

8. An interleaved ring oscillator comprising:
a first ring oscillator having n stages; and
a second ring oscillator having n stages, wherein each stage includes a $n^{th}$ first gated inverter in the first ring oscillator and a $n^{th}$ second gated inverter in the second ring oscillator such that output from the $n^{th}$ first gated inverter enables the $n^{th}$ second gated inverter, and output from the $n^{th}$ second gated inverter enables the $n^{th}$ first gated inverter, wherein a phase difference between a first output of the first ring oscillator and a second output of the second ring oscillator is 90/n.

9. The oscillator of claim 8, wherein the $n^{th}$ first gated inverter is gated by an $n^{th}$ first high-side switch and an $n^{th}$ first low-side switch and the $n^{th}$ second gated inverter is gated by an $n^{th}$ second high-side switch and an $n^{th}$ second low-side switch.

10. The oscillator of claim 9, wherein n is an odd number.

11. A ring oscillator, comprising:
a first ring oscillator and a second ring oscillator, wherein the first ring oscillator and the second ring oscillator are coupled such that the output of the first ring oscillator is an input to the second ring oscillator, and the second ring oscillator is an input to the first ring oscillator, wherein the first ring oscillator and the second ring oscillator each include one or more stages, wherein each stage includes a $n^{th}$ first gated inverter in the first ring oscillator and a $n^{th}$ second gated inverter in the second ring oscillator such that output from the $n^{th}$ first gated inverter enables the $n^{th}$ second gated inverter, and output from the $n^{th}$ second gated inverter enables the $n^{th}$ first gated inverter, wherein the ring oscillator includes a first inverter that is gated by a first high-side switch and a first low-side switch, wherein the second ring oscillator having, in the first stage a second inverter that is gated by a second high-side switch and a second low-side switch, wherein a first output of the first inverter enables the second high-side switch and the second low-side switch, and a second output of the second inverter enables the first high-side switch and the first low-side switch.

12. The ring oscillator of claim 11, wherein the first ring oscillator and second ring oscillator are current starved oscillators.

13. The ring oscillator of claim 11, wherein the first ring oscillator generates a first phase clock signal, and the second ring oscillator generates a second phase clock signal that is out of phase with the first phase clock signal.

14. The ring oscillator of claim 11, wherein output from the first ring oscillator and second ring oscillator have a same frequency.

15. The ring oscillator of claim 11, wherein the first and second ring oscillators produce clock phases that are 18° out of phase of each other and create an output 180 degrees out of phase.

16. The ring oscillator of claim 11, wherein the ring oscillator includes a controller configured to operate one or more multiplexers to generate a 3-phase clock.

* * * * *